(12) United States Patent
Takeuchi et al.

(10) Patent No.: US 11,038,462 B2
(45) Date of Patent: Jun. 15, 2021

(54) SEMICONDUCTOR DEVICE AND WIRELESS COMMUNICATION APPARATUS

(71) Applicant: SONY SEMICONDUCTOR SOLUTIONS CORPORATION, Kanagawa (JP)

(72) Inventors: Hidenori Takeuchi, Kanagawa (JP); Taiwa Okanobu, Tokyo (JP); Naoya Arisaka, Tokyo (JP); Hitoshi Tomiyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/768,779

(22) PCT Filed: Sep. 5, 2018

(86) PCT No.: PCT/JP2018/032801
§ 371 (c)(1),
(2) Date: Jun. 1, 2020

(87) PCT Pub. No.: WO2019/116647
PCT Pub. Date: Jun. 20, 2019

(65) Prior Publication Data
US 2020/0321914 A1    Oct. 8, 2020

(30) Foreign Application Priority Data

Dec. 11, 2017    (JP) .............................. JP2017-236992

(51) Int. Cl.
*H03B 5/12*    (2006.01)
*H03L 7/099*    (2006.01)

(52) U.S. Cl.
CPC ......... *H03B 5/1265* (2013.01); *H03L 7/0992* (2013.01)

(58) Field of Classification Search
CPC ..................................................... H03B 5/1265
USPC ..................................................... 331/107 R
See application file for complete search history.

(56) References Cited

U.S. PATENT DOCUMENTS

| | | | | |
|---|---|---|---|---|
| 6,658,748 | B1 * | 12/2003 | Leipold | H03K 3/354 327/156 |
| 7,019,598 | B2 * | 3/2006 | Duncan | H01F 17/0006 257/E27.046 |
| 2003/0141936 | A1 * | 7/2003 | Staszewski | H03L 7/0991 331/16 |

FOREIGN PATENT DOCUMENTS

| | | |
|---|---|---|
| CN | 102017422 A | 4/2011 |
| EP | 2291915 A1 | 3/2011 |
| JP | 2000-031741 A | 1/2000 |
| JP | 2002-100962 A | 4/2002 |
| JP | 2011-520393 A | 7/2011 |
| JP | 2011-155489 A | 8/2011 |

(Continued)

OTHER PUBLICATIONS

International Search Report and Written Opinion of PCT Application No. PCT/JP2018/032801, dated Nov. 20, 2018, 08 pages of ISRWO.

*Primary Examiner* — Joseph Chang
(74) *Attorney, Agent, or Firm* — Chip Law Group

(57) ABSTRACT

There is provided a semiconductor device including an oscillation circuit that includes a plurality of capacitors provided on a semiconductor substrate, a conversion circuit that converts an analog signal into a digital signal, and a switch circuit that switches the capacitors on the basis of the digital signal. Further, an oscillation frequency linearly varies with respect to a variation in the analog signal.

17 Claims, 24 Drawing Sheets

(56) References Cited

FOREIGN PATENT DOCUMENTS

| | | |
|---|---|---|
| JP | 5668082 B2 | 12/2014 |
| JP | 5668082 B2 | 2/2015 |
| KR | 10-2011-0005730 A | 1/2011 |
| WO | 2009/137620 A1 | 11/2009 |

* cited by examiner

[FIG. 1]
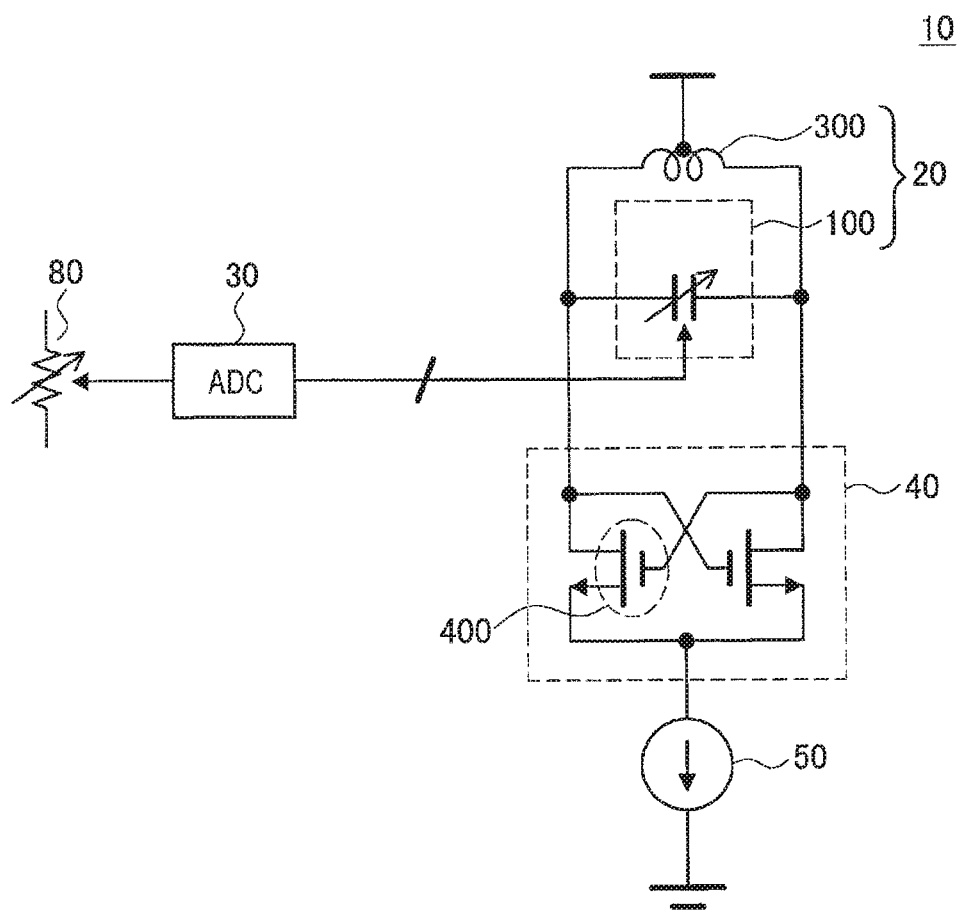

[FIG. 2]
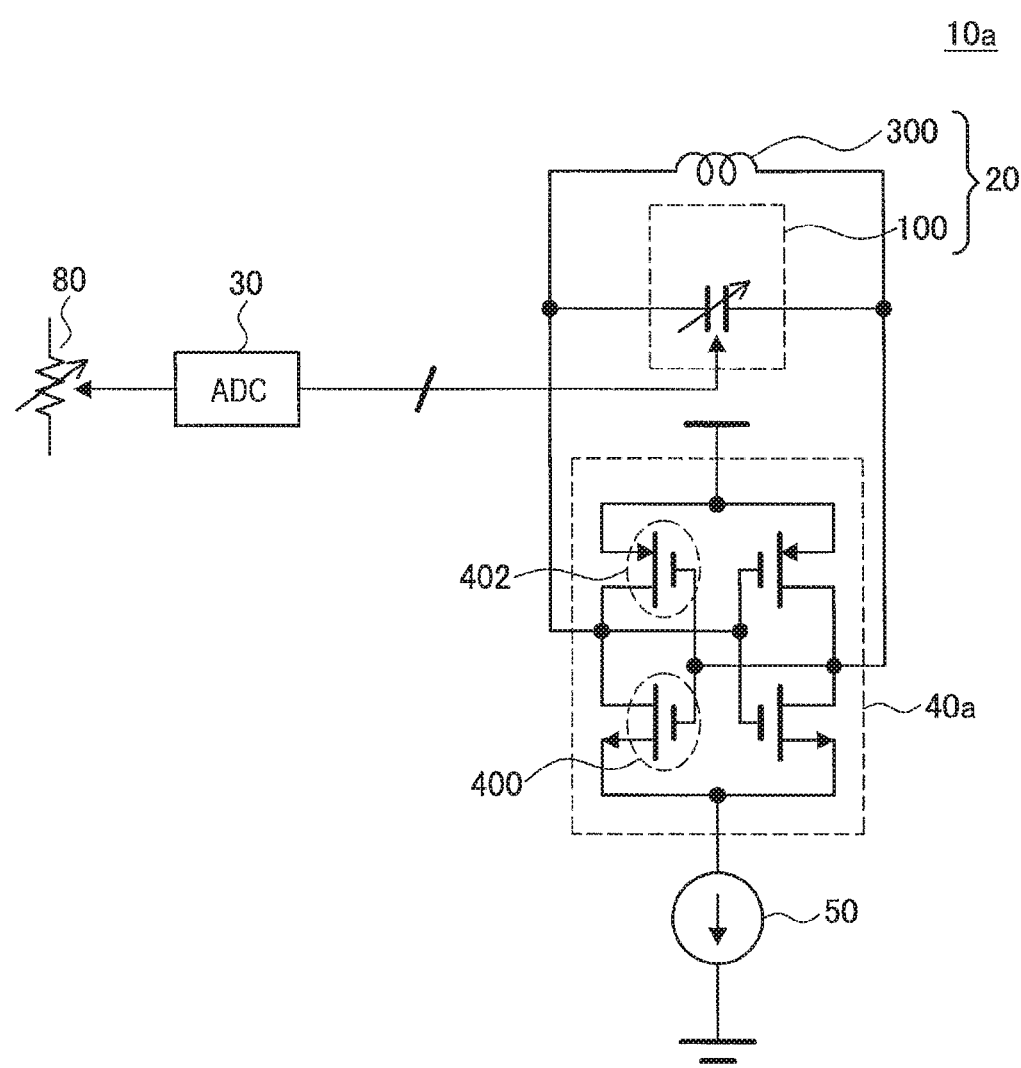

[FIG. 3]
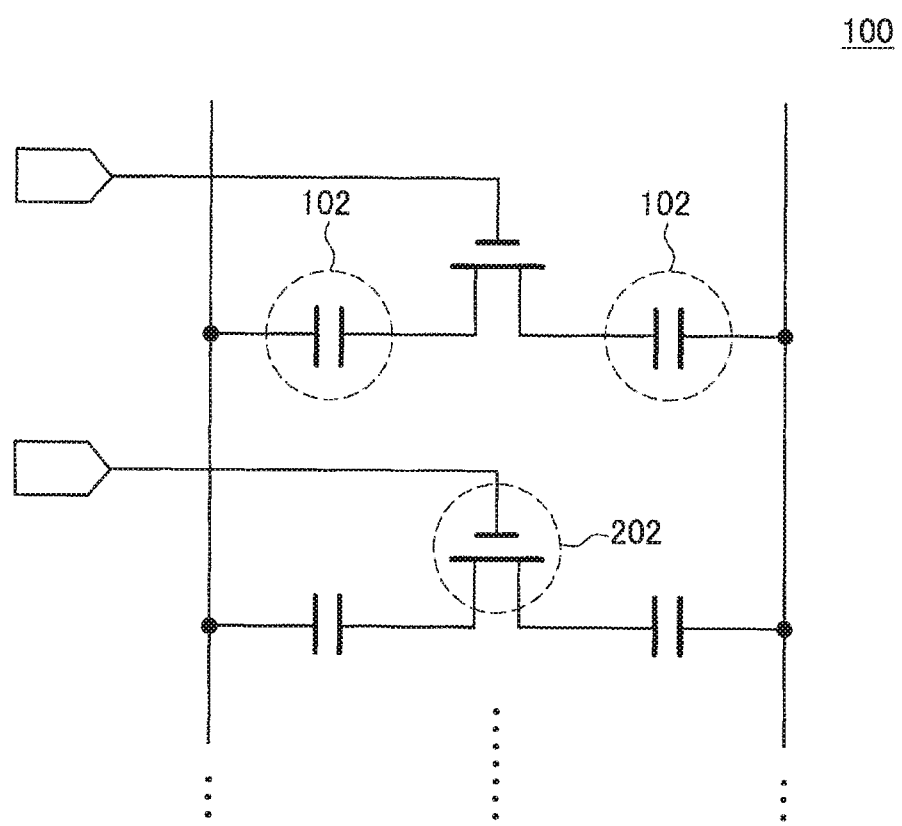

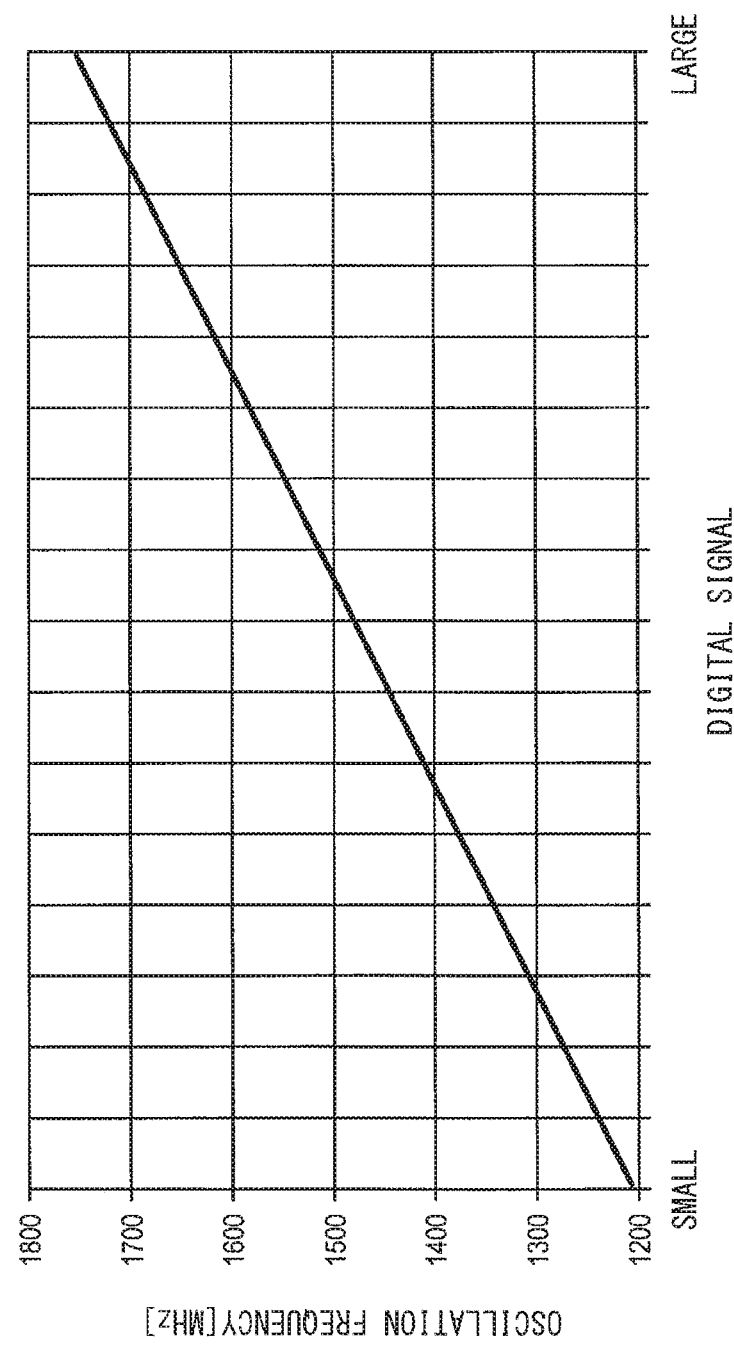
[FIG. 4]

[ FIG. 5 ]
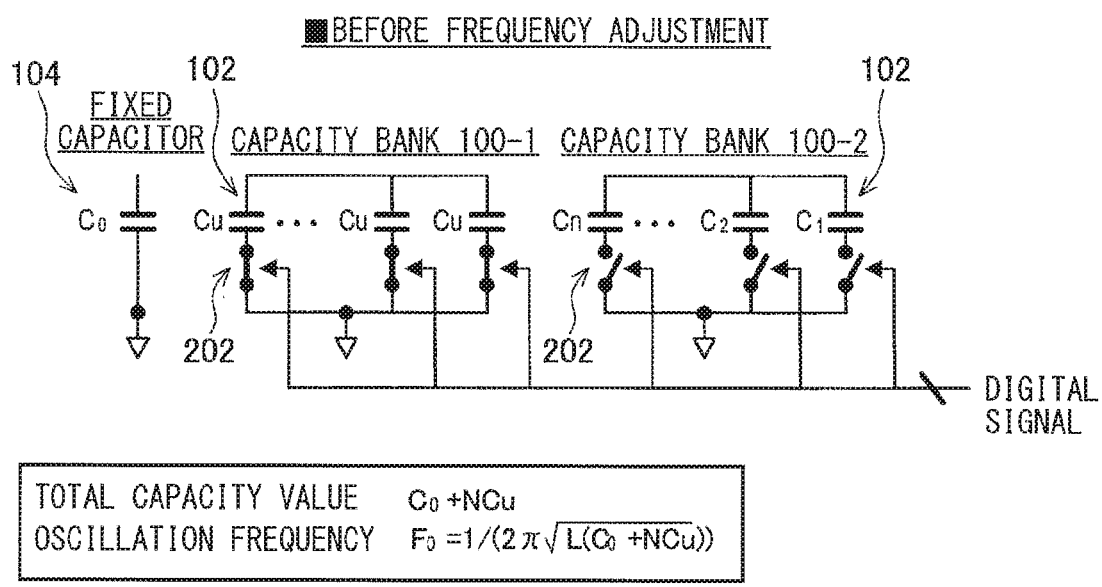

[FIG. 6]
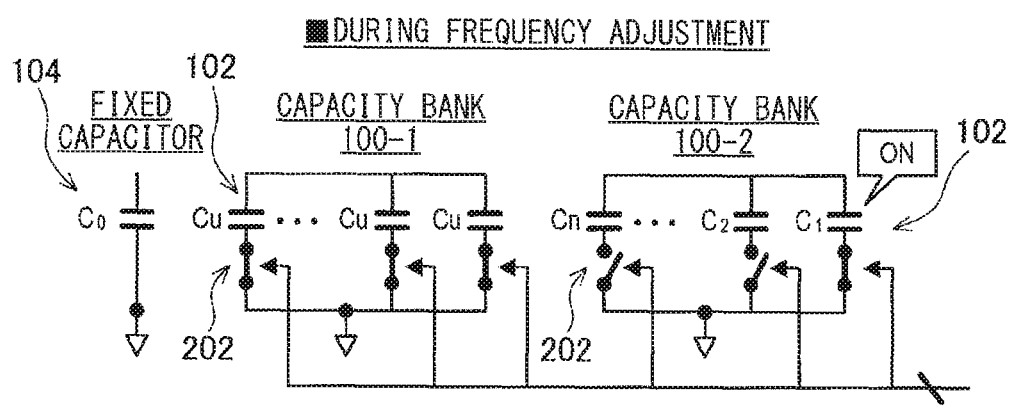

[FIG. 7]
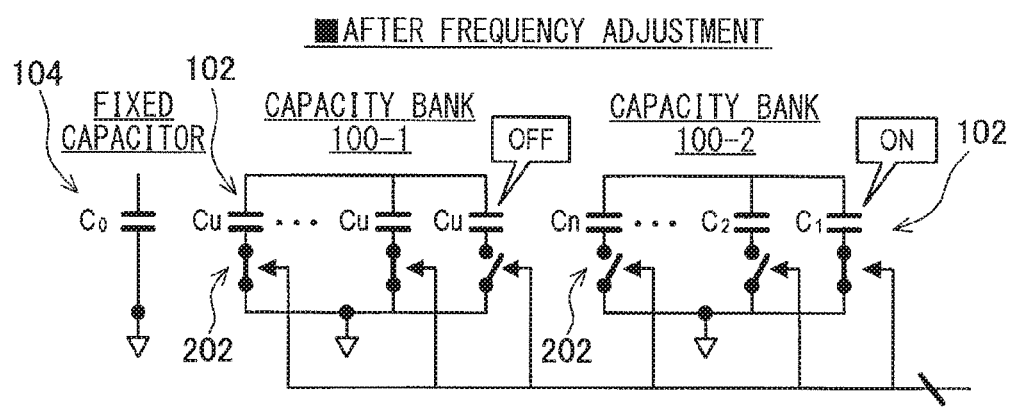

[FIG. 8]
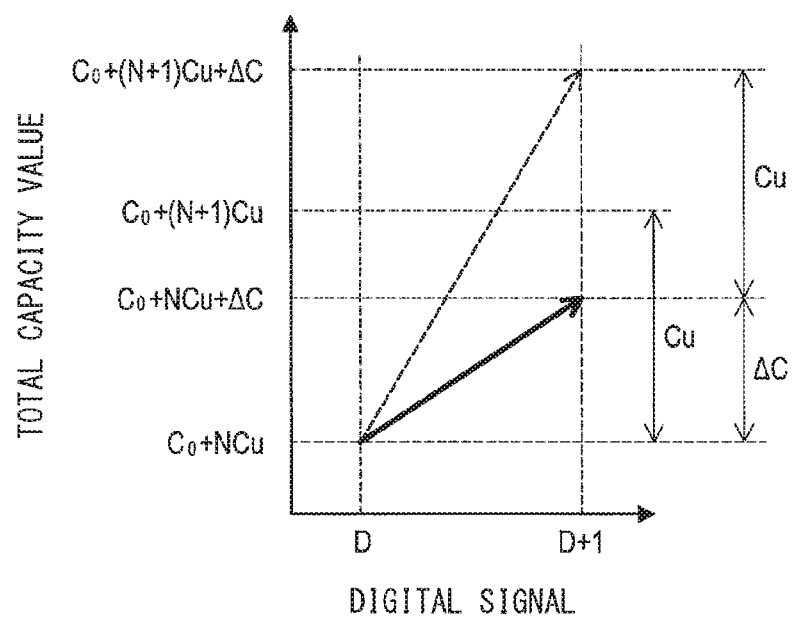

[FIG. 9]
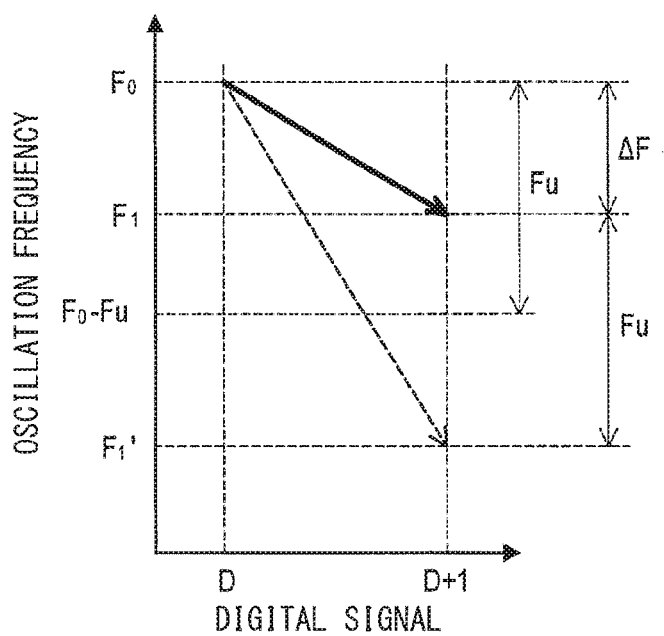

[FIG. 10]
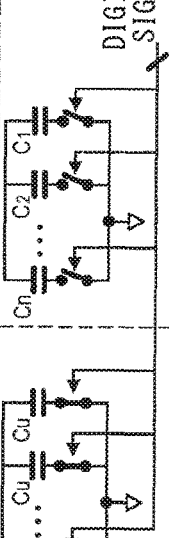

[ FIG. 11 ]
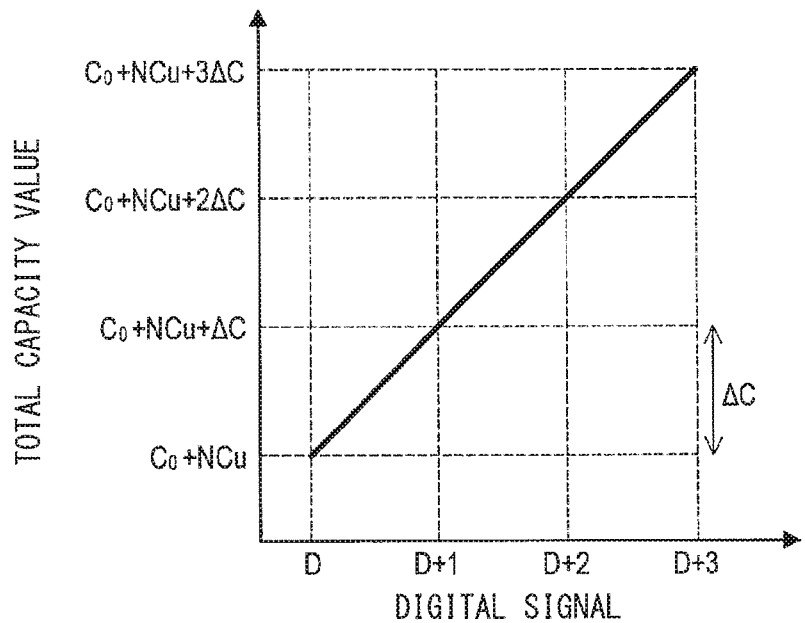
[ FIG. 12 ]
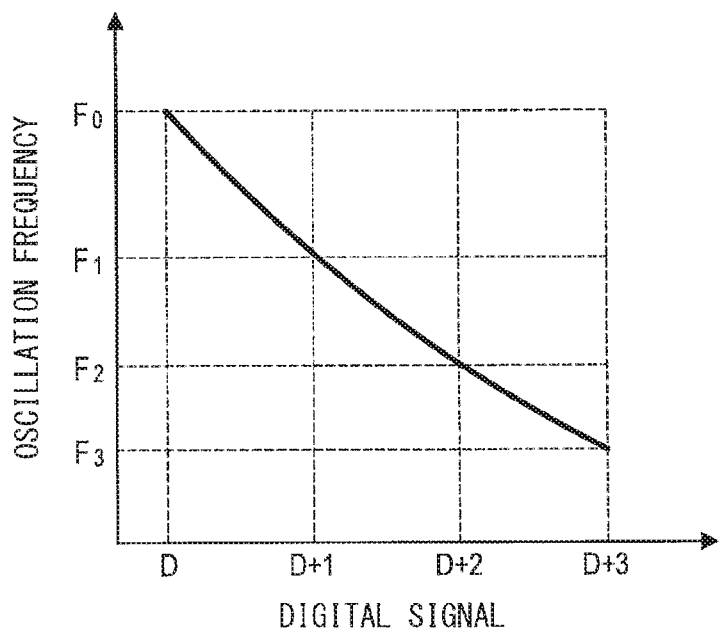

[FIG. 13]
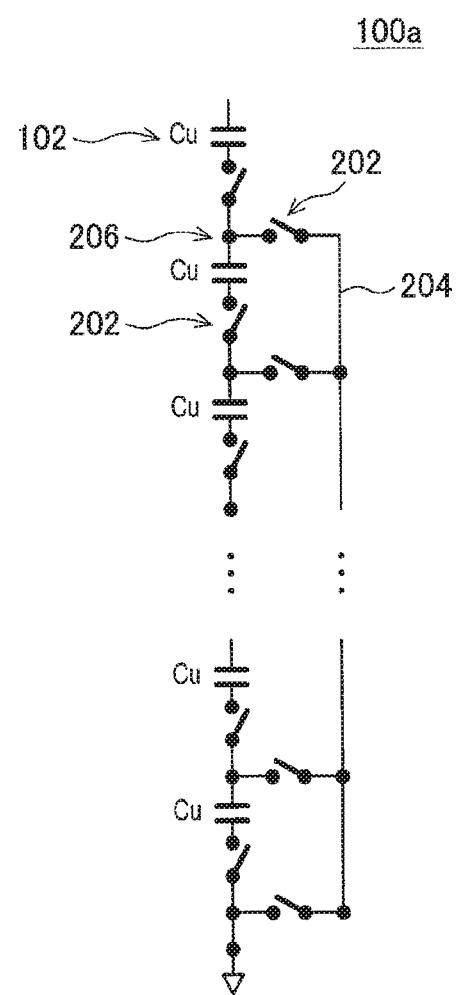

[ FIG. 14 ]

| SIGNAL | BEFORE FREQUENCY ADJUSTMENT | AFTER FREQUENCY ADJUSTMENT |
|---|---|---|
| SERIES COMBINED CAPACITY | $C_{COMBINATION\ 1} = \dfrac{C_u}{M}$ WHERE $M = \dfrac{C_u}{\Delta C}$ | $C_{COMBINATION\ 2} = \dfrac{C_u}{M/2}$ |
| TOTAL CAPACITY VALUE | $C_0 + C_{COMBINATION\ 1} = C_0 + \Delta C$ | $C_0 + C_{COMBINATION\ 2} = C_0 + 2\Delta C$ |
| OPERATION | FIXED CAPACITOR — CAPACITY BANK 100a; 102; 104; number of capacitors 102 coupled in series: M; M capacitors 102 are ON | FIXED CAPACITOR — CAPACITY BANK 100a; 102; 104; M/2 capacitors 102 are ON; number of capacitors 102 coupled in series: M; M/2 capacitors 102 are OFF |

[ FIG. 15 ]
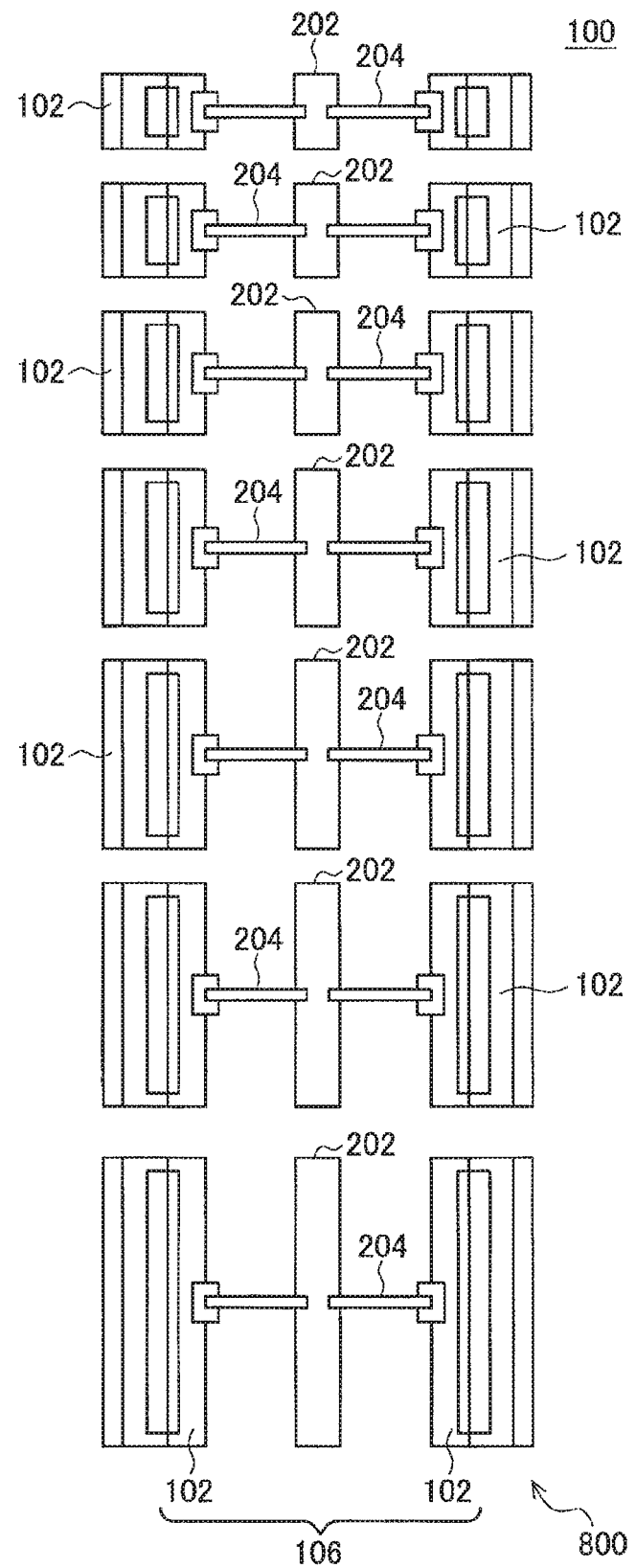

[FIG. 16]
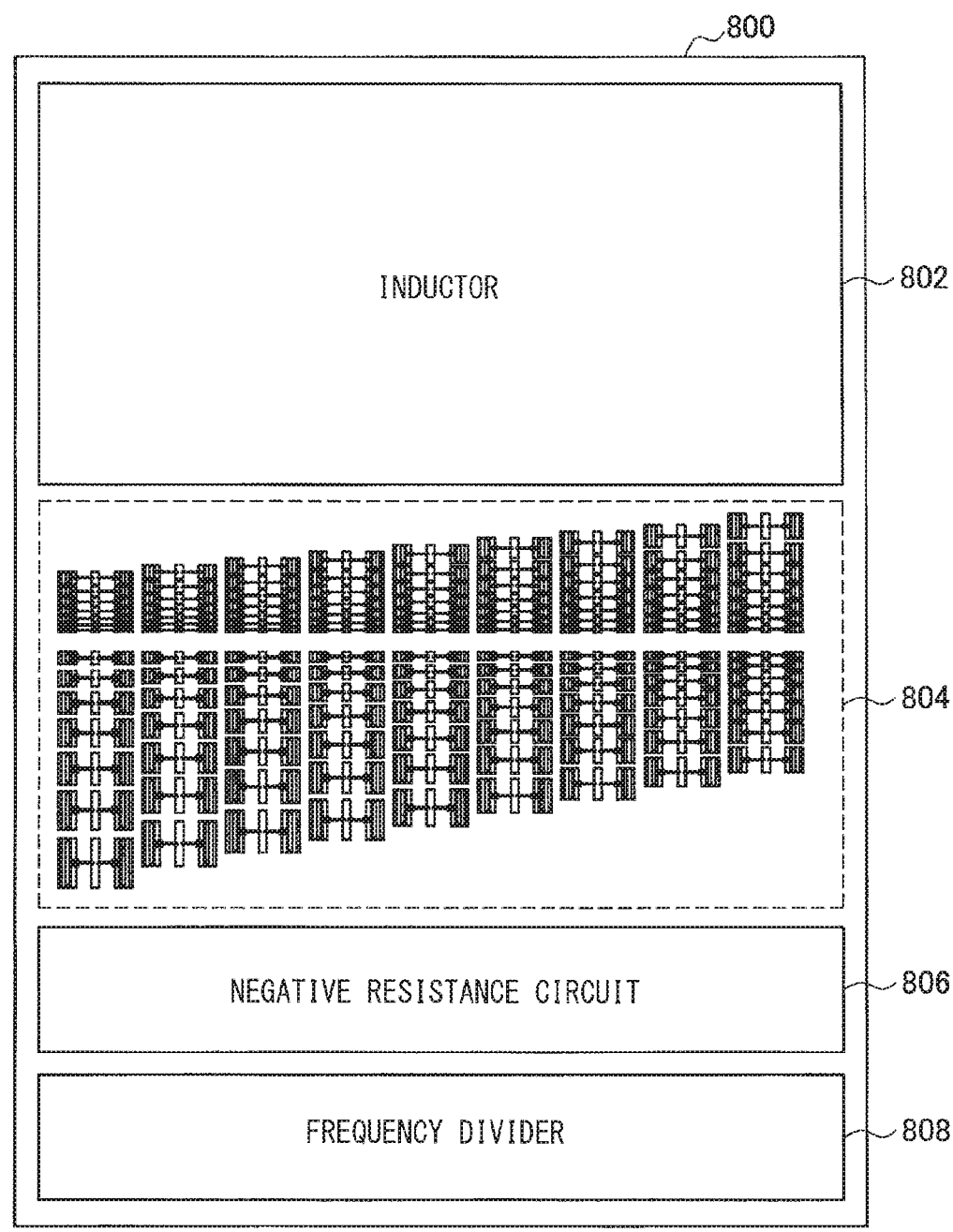

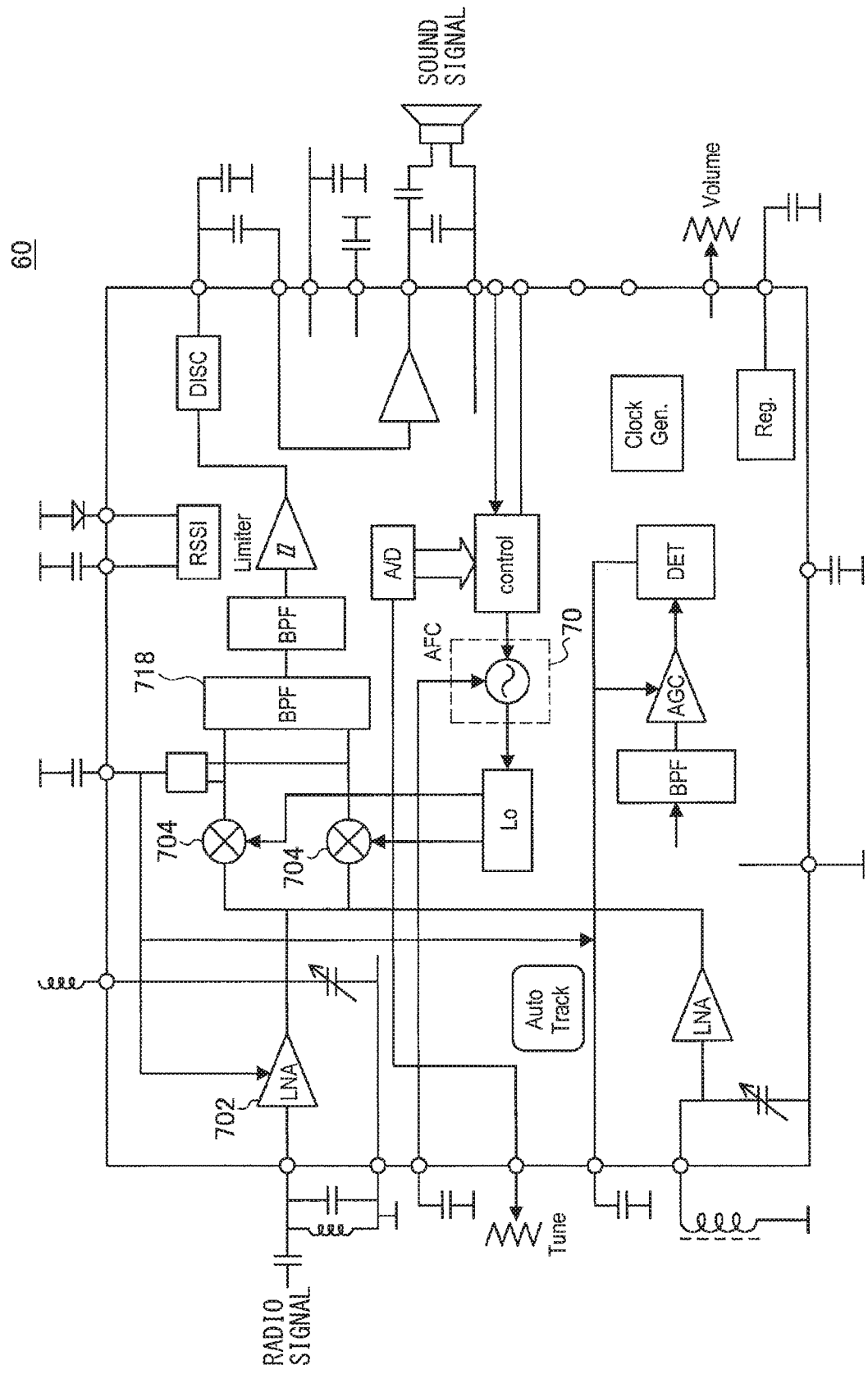
[ FIG. 17 ]

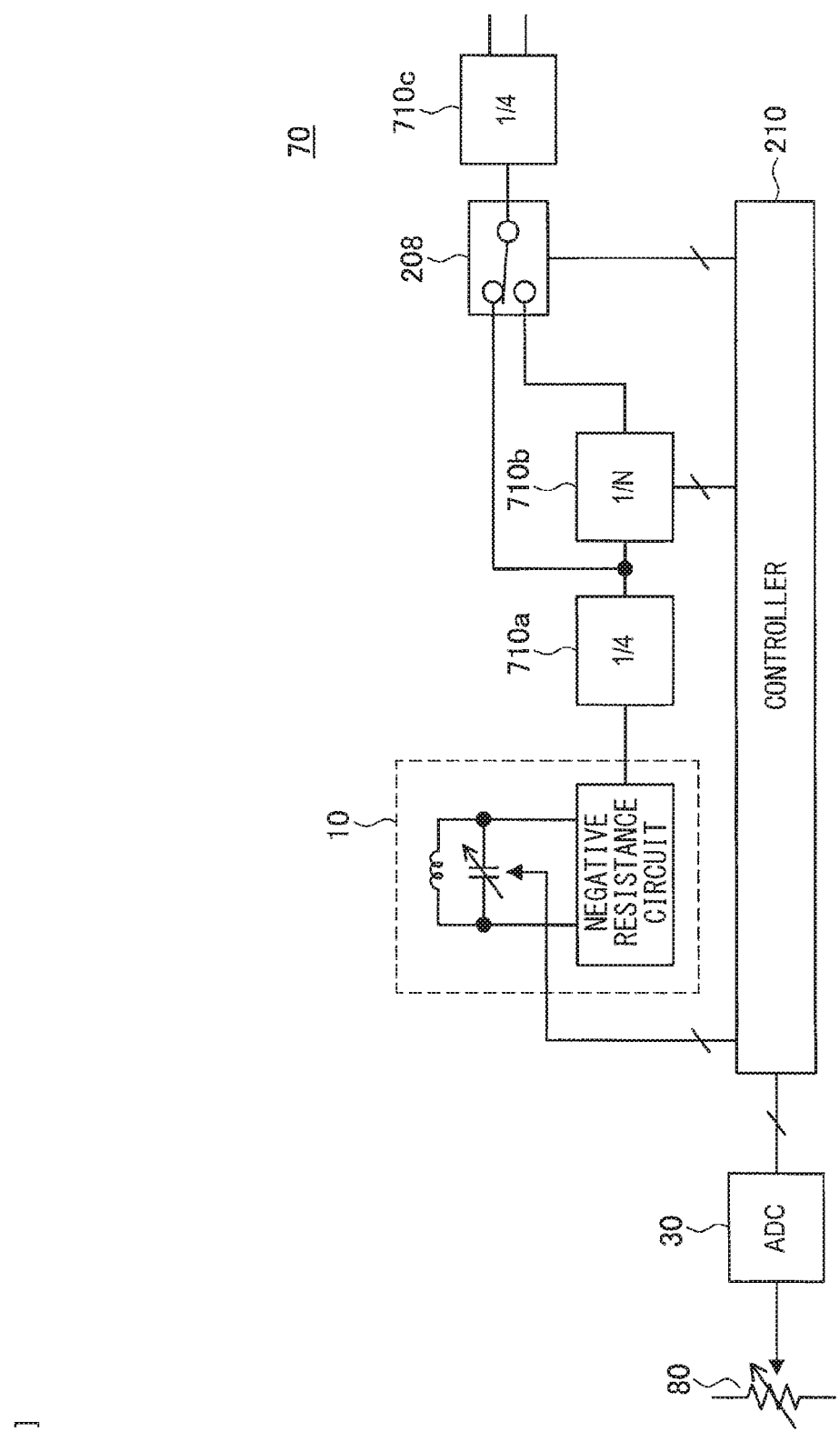
[FIG. 18]

[ FIG. 19 ]

| RECEPTION MODE | OSCILLATION FREQUENCY | FIRST Div | N Div | FINAL Div | TOTAL NUMBER OF DIVIDED FREQUENCIES | LOCAL OSCILLATION FREQUENCY |
|---|---|---|---|---|---|---|
| FM | 1206.4-1752MHz | 4 | NONE | 4 | 16 | 76-108MHz |
| AM(MW1) | 1206.4-1752MHz | 4 | 131 | 4 | 2096 | 575.6-835.6kHz |
| AM(MW2) | 1206.4-1752MHz | 4 | 90 | 4 | 1440 | 837.8-1216.7kHz |
| AM(MW3) | 1206.4-1752MHz | 4 | 62 | 4 | 992 | 1216.1-1766.1kHz |

[FIG. 20]
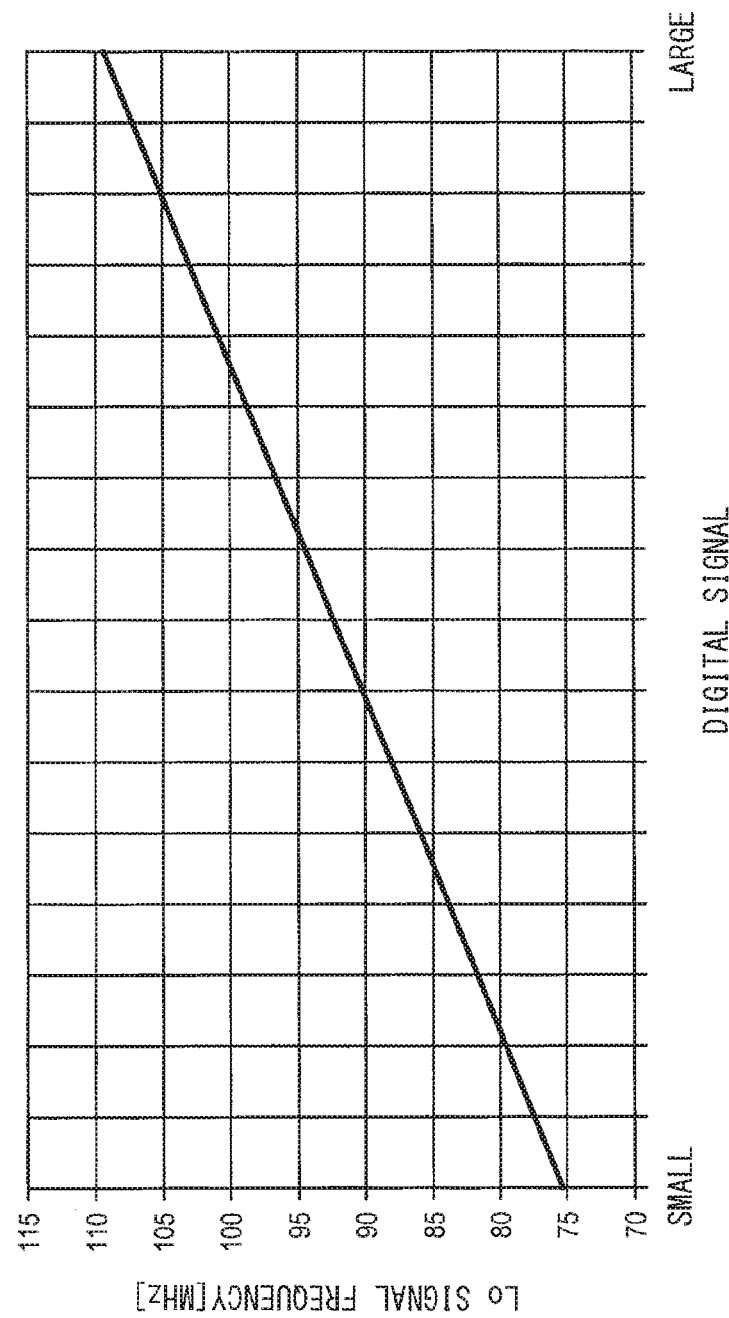

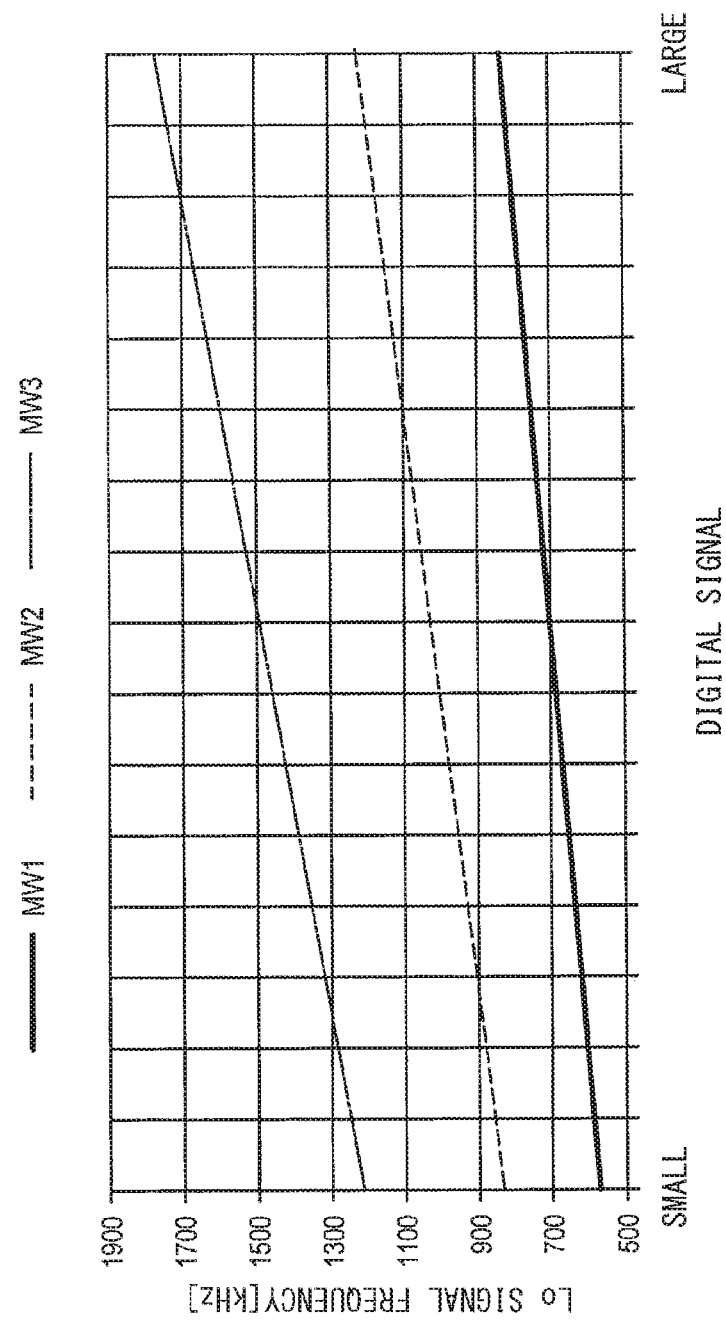
[FIG. 21]

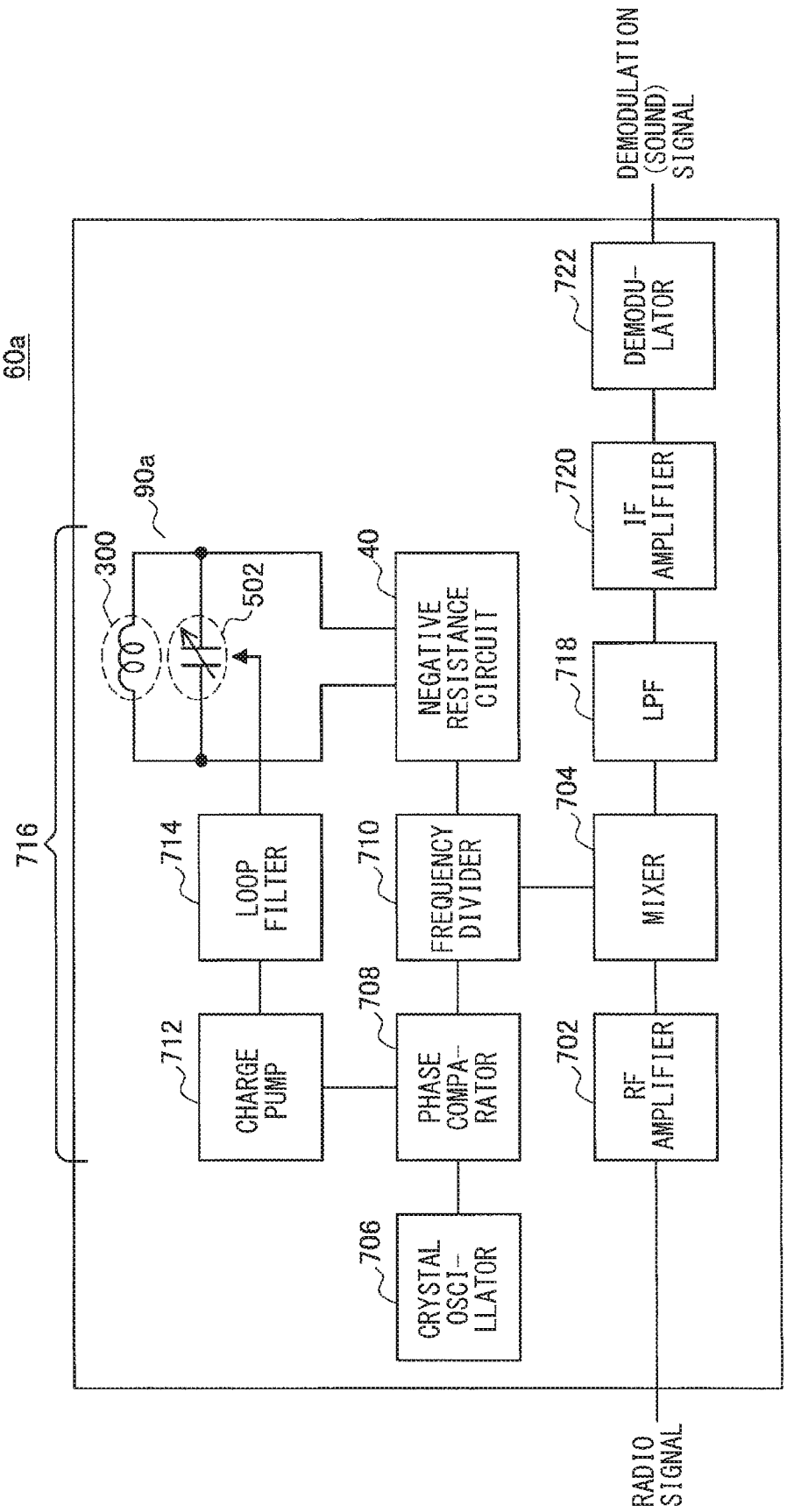
[ FIG. 22 ]

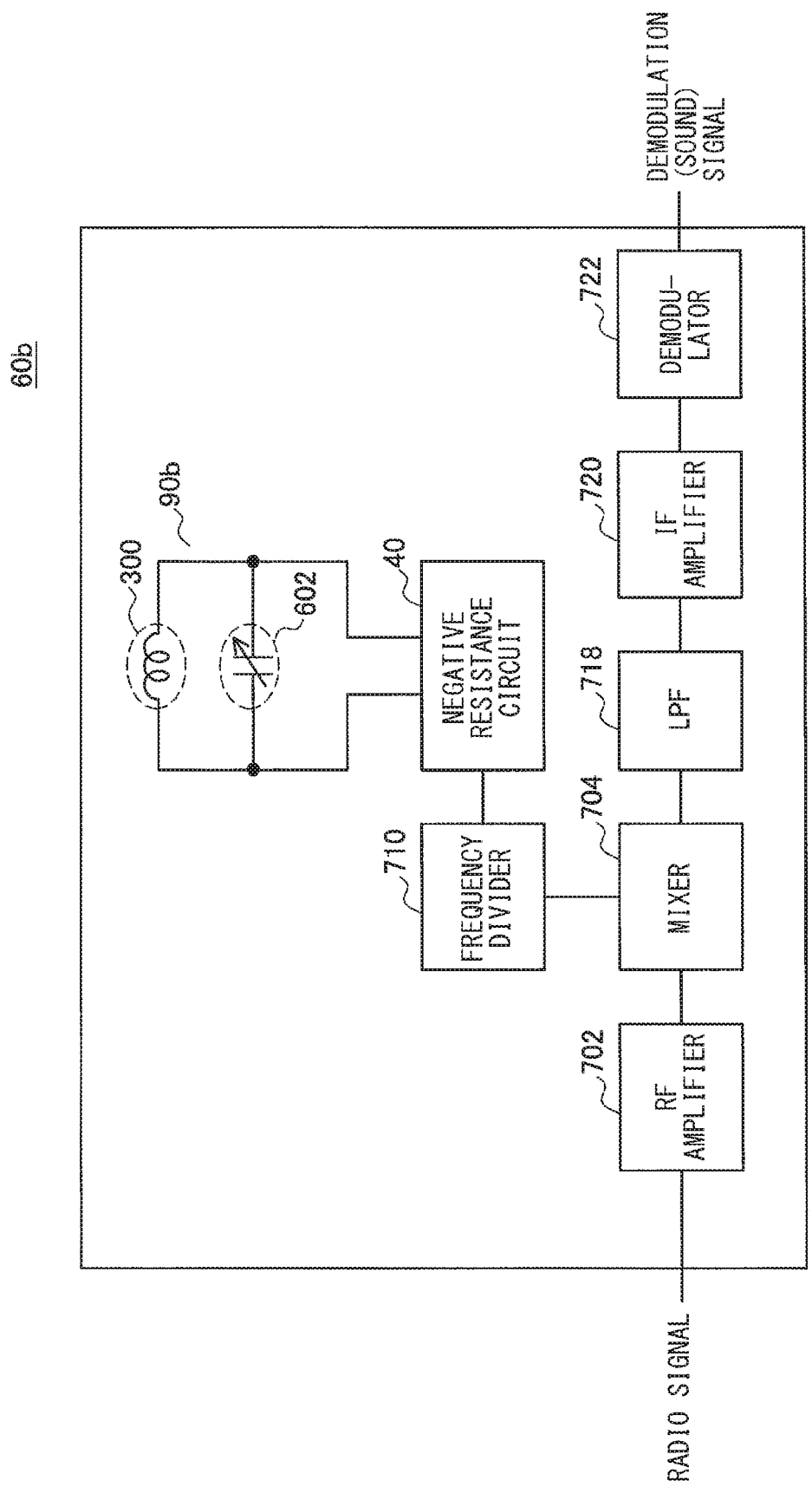
[FIG. 23]

[ FIG. 24 ]
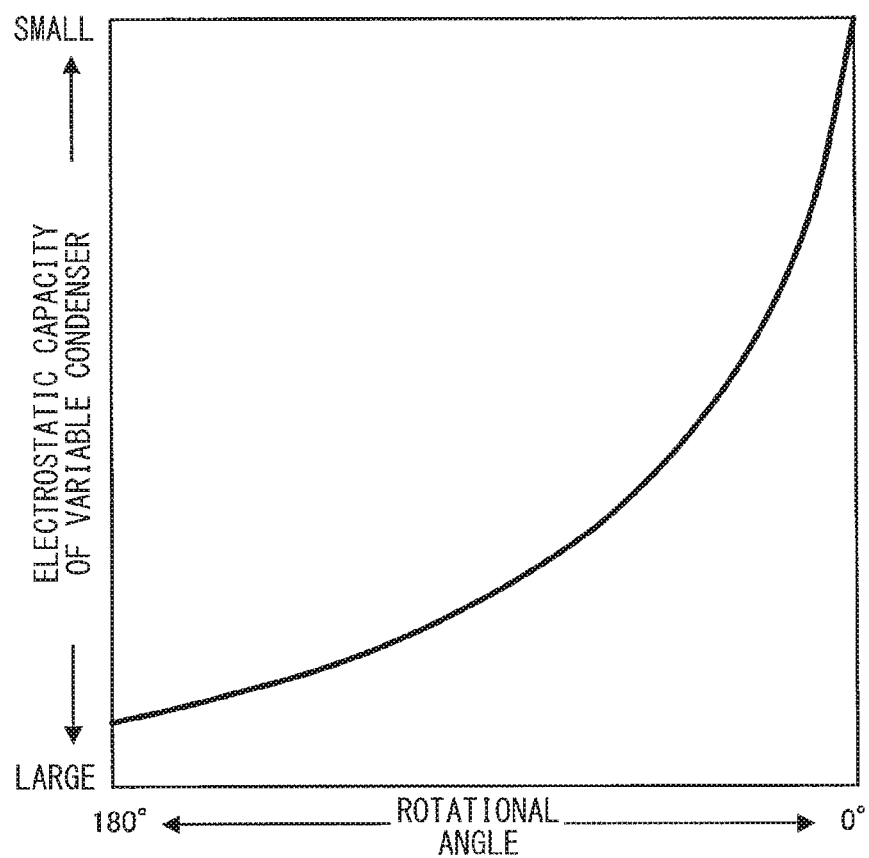

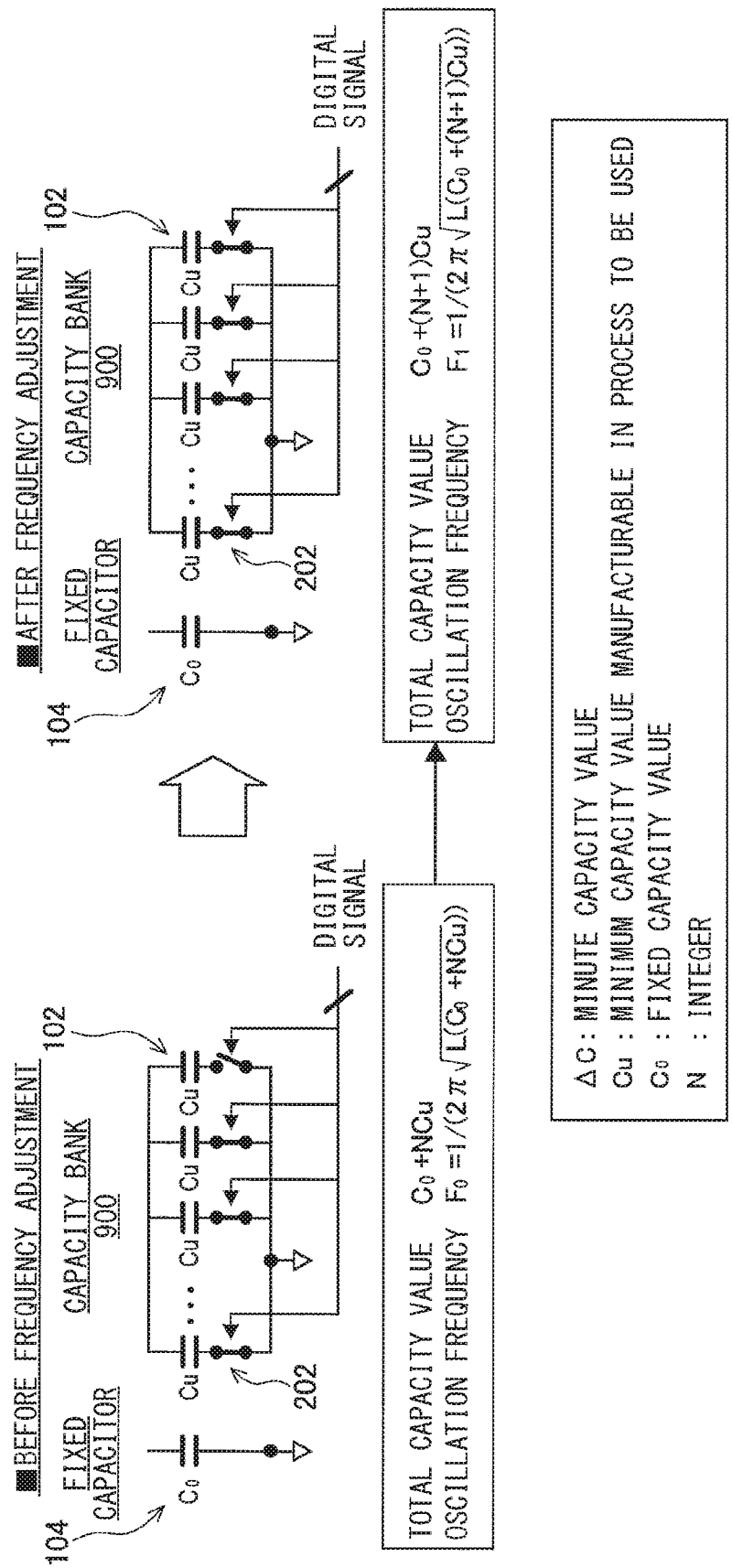

SEMICONDUCTOR DEVICE AND WIRELESS COMMUNICATION APPARATUS

CROSS REFERENCE TO RELATED APPLICATIONS

This application is a U.S. National Phase of International Patent Application No. PCT/JP2018/032801 filed on Sep. 5, 2018, which claims priority benefit of Japanese Patent Application No. JP 2017-236992 filed in the Japan Patent Office on Dec. 11, 2017. Each of the above-referenced applications is hereby incorporated herein by reference in its entirety.

TECHNICAL FIELD

The present disclosure relates to a semiconductor device and a wireless communication apparatus.

BACKGROUND ART

A radio receiver is able to obtain a sound signal by amplifying a high-frequency radio signal with an RF (Radio Frequency) amplifier, converting the amplified radio signal into an IF (Intermediate Frequency) signal having a low frequency with a mixer circuit, and performing demodulation with a demodulator by using the converted IF signal. It is possible to perform frequency conversion for converting a high-frequency radio signal into an IF signal by multiplying a local oscillation signal by the radio signal in the above-described mixer circuit. The local oscillation signal has a frequency corresponding to the sum of the input frequency of the radio signal and the frequency of the IF signal.

Accordingly, to accurately and stably control the frequency of the local oscillation signal, the radio receiver is sometimes provided with a PLL (Phase Locked Loop) synthesizer that controls the frequency of the local oscillation signal. The PLL synthesizer is able to accurately and stably obtain a local oscillation signal having a desired frequency by providing feedback for matching with the phase of a signal from a crystal oscillator that oscillates a signal having a fixed frequency. In addition, the use of the PLL synthesizer allows the radio receiver to not only obtain a local oscillation signal having a desired frequency accurately and stably, but also obtain a plurality of types of local oscillation signals having different frequencies with one crystal oscillator alone. For example, a circuit configuration including the PLL synthesizer includes PTL 1 below.

However, in a case where the radio receiver is provided with a PLL synthesizer as described above, various circuit blocks and parts such as a phase comparator are necessary. This increases the manufacturing cost, and further leads to increase in the power consumption. Accordingly, there is a radio receiver provided with a variable condenser instead of the PLL synthesizer as described above to suppress increase in the manufacturing cost and the power consumption. The variable condenser is a mechanical part whose electrostatic capacity value is manually variable by a user. Providing the variable condenser to an oscillator that generates a local oscillation signal in the radio receiver thus makes it possible to linearly and continuously vary the frequency of the local oscillation signal in accordance with variations in electrostatic capacity. The radio receiver including such a variable condenser has less accuracy of controlling the frequency of a local oscillation signal than that of the radio receiver including a PLL synthesizer, but makes it possible to suppress increase in the manufacturing cost and the power consumption.

CITATION LIST

Patent Literature

PTL 1: Japanese Patent No. 5668082

SUMMARY OF THE INVENTION

Problems to be Solved by the Invention

In recent years, however, less variable condensers have been manufactured, and the price of a variable condenser is increasing as a result. It is thus difficult to suppress the manufacturing cost and the power consumption while maintaining the operability of a radio receiver to allow a user to manually select a radio broadcasting station. A semiconductor device provided with a novel oscillation circuit (oscillator) and mounted on a radio receiver has been requested in such a situation to suppress the manufacturing cost and the power consumption while maintaining the manual operability.

Accordingly, the present disclosure proposes a novel and improved semiconductor device and wireless communication apparatus each of which makes it possible to suppress the manufacturing cost and the power consumption while maintaining the manual operability.

Means for Solving the Problems

According to the present disclosure, there is provided a semiconductor device including: an oscillation circuit including a plurality of capacitors provided on a semiconductor substrate; a conversion circuit that converts an analog signal into a digital signal; and a switch circuit that switches the capacitors on the basis of the digital signal. An oscillation frequency linearly varies with respect to a variation in the analog signal.

In addition, according to the present disclosure, there is provided a wireless communication apparatus including a semiconductor device including an oscillation circuit including a plurality of capacitors provided on a semiconductor substrate, a conversion circuit that converts an analog signal into a digital signal, and a switch circuit that switches the capacitors on the basis of the digital signal. An oscillation frequency linearly varies with respect to a variation in the analog signal.

Effects of the Invention

According to the present disclosure as described above, it is possible to provide a semiconductor device and a wireless communication apparatus each of which makes it possible to suppress the manufacturing cost and the power consumption while maintaining the manual operability.

It is to be noted that the above-described effects are not necessarily limitative. Any of the effects indicated in this description or other effects that may be understood from this description may be exerted in addition to the above-described effects or in place of the above-described effects.

BRIEF DESCRIPTION OF DRAWING

FIG. 1 is a circuit diagram schematically illustrating a configuration of an oscillator 10 according to a first embodiment of the present disclosure.

FIG. 2 is a circuit diagram schematically illustrating a configuration of an oscillator 10a according to a modification example of the embodiment.

FIG. 3 is a circuit diagram schematically illustrating a configuration of a capacity bank 100 according to the embodiment.

FIG. 4 is a graph illustrating an example of a variation in an oscillation frequency of an oscillator 10 according to the embodiment.

FIG. 5 is an explanatory diagram (first) for describing a method of controlling a frequency according to a second embodiment of the present disclosure.

FIG. 6 is an explanatory diagram (second) for describing the method of controlling the frequency according to the embodiment.

FIG. 7 is an explanatory diagram (third) for describing the method of controlling the frequency according to the embodiment.

FIG. 8 is an explanatory diagram (first) describing an example of a variation in a capacity value in the method of controlling the frequency according to the embodiment.

FIG. 9 is an explanatory diagram (first) describing an example of a variation in an oscillation frequency in the method of controlling the frequency according to the embodiment.

FIG. 10 is an explanatory diagram (fourth) for describing the method of controlling the frequency according to the embodiment.

FIG. 11 is an explanatory diagram (second) describing an example of a variation in the capacity value in the method of controlling the frequency according to the embodiment.

FIG. 12 is an explanatory diagram (second) describing an example of a variation in the oscillation frequency in the method of controlling the frequency according to the embodiment.

FIG. 13 is a circuit diagram schematically illustrating a configuration of a capacity bank 100a according to a third embodiment of the present disclosure.

FIG. 14 is an explanatory diagram for describing a method of controlling a frequency according to the embodiment.

FIG. 15 is a layout diagram schematically illustrating a configuration example of a capacitor 102 according to a fourth embodiment of the present disclosure.

FIG. 16 is a layout diagram schematically illustrating a configuration example of the oscillator 10 according to the embodiment.

FIG. 17 is a circuit diagram schematically illustrating a configuration of a radio receiver 60 according to a fifth embodiment of the present disclosure.

FIG. 18 is a circuit diagram schematically illustrating a configuration of a local oscillation signal generator 70 according to a sixth embodiment of the present disclosure.

FIG. 19 is an explanatory diagram for describing frequency division by the local oscillation signal generator 70 according to the embodiment.

FIG. 20 is a graph (first) illustrating an example of a variation in a frequency of the local oscillation signal generator 70 according to the embodiment.

FIG. 21 is a graph (second) illustrating an example of a variation in the frequency of the local oscillation signal generator 70 according to the embodiment.

FIG. 22 is a circuit diagram schematically illustrating a configuration of a radio receiver 60a according to a comparative example.

FIG. 23 is a circuit diagram schematically illustrating a configuration of a radio receiver 60b according to a comparative example.

FIG. 24 is a graph illustrating an example of a variation in a capacity value of a variable condenser 602 relative to a rotational angle.

FIG. 25 is an explanatory diagram for describing a method of controlling a frequency according to a comparative example.

MODES FOR CARRYING OUT THE INVENTION

The following describes a preferred embodiment of the present disclosure in detail with reference to the accompanying drawings. It is to be noted that, in this description and the accompanying drawings, components that have substantially the same functional configuration are indicated by the same reference signs, and thus redundant description thereof is omitted.

In addition, in this description and the drawings, a plurality of components that has substantially the same or similar functional configuration is sometimes distinguished from each other by attaching different numerals after the same reference numerals. However, in a case where there is no need in particular to distinguish a plurality of components that has substantially the same or similar functional configuration, the same reference signs alone are attached. In addition, similar components of different embodiments are sometimes distinguished by attaching different alphabets to the same reference numerals. However, in a case where there is no need in particular to distinguish similar components from each other, the same reference signs alone are attached.

Further, when describing a circuit configuration below, unless otherwise specified, "coupling" refers to electrical coupling between a plurality of elements. Further, "coupling" in the following description includes not only a case of coupling a plurality of elements directly and electrically, but also a case of coupling a plurality of elements indirectly and electrically via another element. In addition, in the following description, "coupling in series" means coupling a plurality of elements in a line, and "coupling in parallel" means coupling two respective terminals of elements to each other. For example, in a case where there are two elements each including an A terminal and a B terminal, coupling the B terminal of one of the elements and the A terminal of the other element is referred to as coupled in series, and coupling the respective A terminals of the two elements to each other and coupling the respective B terminals to each other are referred to as coupled in parallel.

In addition, the layout diagrams to be referred to in the following description are intended to describe an embodiment of the present disclosure and promote an understanding thereof, and in some cases, shapes, dimensions, ratios, etc. illustrated in the drawings are different from reality for better understanding. Further, it is possible to change the design of the shape of each element, etc. illustrated in the drawings as appropriate upon consideration of the following description and the known art.

It is to be noted that description is given in the following order.

1. Background to the creation of an embodiment of the present disclosure by the inventors of the present application
2. First embodiment
3. Second embodiment
3.1 Comparative example
3.2 Present embodiment 1
3.3 Present embodiment 2

4. Third embodiment
4.1 Configuration of capacity bank 100*a*
4.2 Method of controlling frequency
5. Fourth embodiment
6. Fifth embodiment
6.1 Configuration of radio receiver 60
6.2 Configuration of local oscillation signal generator 70
7. Conclusion
8. Supplement

1. Background to the Creation of an Embodiment of the Present Disclosure by the Inventors of the Present Application An embodiment of the present disclosure described below relates to an oscillator usable for a radio receiver, a local oscillation signal generator including the oscillator, and a radio receiver including these. The oscillator according to the embodiment of the present disclosure described below is not, however, limited to use for a radio receiver, but is usable for various wireless communication apparatuses.

The background to the creation of the embodiment of the present disclosure by the inventors of the present application is first described with reference to FIGS. 22 to 24 before the embodiment of the present disclosure is described in detail. FIGS. 22 and 23 are circuit diagrams schematically illustrating configuration examples of radio receivers 60*a* and 60*b* according to a comparative example. In addition, FIG. 24 is a graph illustrating an example of variations in the capacity value of a variable condenser 602 relative to a rotational angle. It is to be noted that the comparative example here means radio receivers, variable condensers, and the like studied before the inventors of the present application create the embodiment of the present disclosure.

The radio receiver 60*a* amplifies a high-frequency radio signal that has been subjected to modulation such as AM (Amplitude Moduration) or FM (Frequency Moduration) with an RF amplifier 702, and converts the amplified radio signal into an IF signal having a low frequency with a mixer circuit 704, for example, as illustrated in FIG. 22. Further, the radio receiver 60*a* removes an unnecessary signal from the converted IF signal with a band-pass filter 718, and amplifies the converted IF signal with an IF amplifier 720. Thereafter, the radio receiver 60*a* demodulates the converted IF signals with a demodulator 722. The radio receiver 60*a* is hereby able to obtain a sound signal. As described above, it is possible to perform frequency conversion for converting a high-frequency radio signal into an IF signal by multiplying a local oscillation signal by the radio signal in the above-described mixer circuit 704. The local oscillation signal has a frequency corresponding to the sum of the input frequency of the radio signal and the frequency of the IF signal.

A local oscillation signal is requested to have a broadband frequency to cover the entire band of a radio signal. This requests an oscillator 90*a* to considerably vary the frequency of an oscillation signal. The oscillator 90*a* generates a local oscillation signal. Examples of the oscillator 90*a* like this include a configuration in which an inductor 300, a variable capacitor 502, and a negative resistance circuit 40 are coupled in parallel as illustrated in FIG. 23. In a case where the inductance value of the inductor 300 is represented as L and the capacity value of the variable capacitor 502 is represented as C in the oscillator 90*a*, it is possible to express a frequency F of an oscillation signal generated by the oscillator 90*a* as Expression (1) below.

[Expression 1]

$$F = \frac{1}{2\pi\sqrt{LC}} \quad (1)$$

Varying the capacity value of the variable capacitor 502 then allows the oscillator 90*a* to considerably vary the frequency of an oscillation signal. This allows a local oscillation signal to have a broadband frequency that covers the entire band of a radio signal.

If described in detail, the radio receiver 60*a* is able to select a broadcast of a desired radio station by varying the frequency of an oscillation signal of the oscillator 90*a* and tuning the frequency to the frequency of a radio signal for a desired radio station as described above. Without highly accurately tuning the radio receiver 60*a* to the frequency of a radio signal for a desired radio station at this time, it is not possible to correctly select a station. The radio receiver 60*a* is thus requested to accurately vary the frequency of a local oscillation signal.

More specifically, the radio receiver 60*a* according to the comparative example includes the voltage controlled oscillator 90*a* including the variable capacitor 502 whose capacity value varies in accordance with an input voltage as illustrated in FIG. 22. Further, the radio receiver 60*a* includes a PLL synthesizer 716 that uses the accuracy of the frequency of a reference signal generated by a crystal oscillator 706 to highly accurately control the frequency of an oscillation signal. The PLL synthesizer 716 includes a phase comparator 708, a frequency divider 710, a charge pump 712, a loop filter 714, and the like in addition to the oscillator 90*a*. The PLL synthesizer 716 inputs a signal from the crystal oscillator 706 that oscillates a signal having a fixed frequency and a signal obtained by dividing the frequency of an oscillation signal from the oscillator 90*a* to the phase comparator 708. The PLL synthesizer 716 compares the phases of the respective signals and provides feedback to the oscillator 90*a* to make the phases match. This allows the radio receiver 60*a* to accurately and stably obtain an oscillation signal having a desired frequency. In addition, varying the number of frequencies divided by the above-described frequency divider 710 allows the radio receiver 60*a* to vary the frequency of an oscillation signal and allows the oscillation signal to have a broadband frequency that covers the entire band of a radio signal. The frequency of an oscillation signal generated by the oscillator 90*a* is thus set to be an integer multiple of the frequency of a reference signal transmitted by the crystal oscillator 706.

However, in a case where the radio receiver 60*a* is provided with the PLL synthesizer 716 as illustrated in FIG. 22, the crystal oscillator 706 that generates a reference signal, the phase comparator 708, the frequency divider 710, the charge pump 712, the loop filter 714, and the like are necessary in addition to the voltage controlled oscillator 90*a* whose frequency varies in accordance with an input voltage. Further, a microcomputer (not illustrated) for control, a liquid crystal display (not illustrated), and the like are also necessary in the radio receiver 60*a*. The radio receiver 60*a* according to the comparative example illustrated in FIG. 22 is therefore able to accurately and stably obtain an oscillation signal having a desired frequency, but requests various circuit blocks. This increases the manufacturing cost, and further leads to increase in the power consumption.

The inexpensive and low-power consuming radio receiver 60b that has to operate for a long time with a dry battery or the like such as an emergency radio receiver as used at the time of a disaster then include a radio receiver that does not include the PLL synthesizer 716 as described above. If described in detail, as illustrated in FIG. 23, the radio receiver 60b does not include the PLL synthesizer 716, but includes a variable condenser 602 in the oscillator 90b instead. A user is able to manually and mechanically vary the electrostatic capacity value of the variable condenser 602.

For example, it is possible to vary the electrostatic capacity value of the variable condenser 602 by rotating one of the electrodes of an electrode pair to vary the facing area of the electrode pair. Specifically, as illustrated in FIG. 24, rotating one of electrodes of an electrode pair of the variable condenser 602 makes it possible to continuously vary the electrostatic capacity value of the variable condenser 602. It is assumed that the variable condenser 602 has a curved relationship between a rotational angle and an electrostatic capacity as illustrated in FIG. 24. This makes it possible to linearly vary the frequency of an oscillation signal generated by the oscillator 90a with respect to an angle of manual rotation by a user. It is thus possible in the radio receiver 60b to linearly and continuously the frequency of an oscillation signal within a minute variation range in accordance with a manual operation of a user. The radio receiver 60b thus has less accuracy of controlling the frequency of an oscillation signal than that of the radio receiver including the PLL synthesizer 716, but is able to be manually operated by a user directly when selecting a radio broadcasting station. This makes it possible to suppress increase in the manufacturing cost and the power consumption.

In recent years, however, the less variable condensers 602 have been manufactured as described above, and the price of the variable condenser 602 is increasing as a result. The radio receiver 60b requested to be inexpensive and consume less power has been thus requested to replace the variable condenser 602 with another part. Various parts are conceivable as the other part with which the variable condenser 602 is replaced, but a part is more preferable that is manufacturable on a semiconductor chip (semiconductor device) as with another circuit block of the radio receiver 60b to further suppress increase in the manufacturing cost.

Accordingly, in view of the situations as described above, the inventors of the present application have created the embodiment of the present disclosure that makes it possible to linearly and continuously vary the frequency of an oscillation signal within a minute variation range in accordance with a manual operation of a user as with the radio receiver 60b including the variable condenser 602, and suppress the manufacturing cost and the power consumption while maintaining the manual operability.

If described in detail, the embodiment of the present disclosure created by the inventors of the present application is an oscillator including a capacitor provided on a semiconductor chip instead of a mechanical part provided to the outside of the semiconductor chip like the variable condenser 602. In the present embodiment, the electrostatic capacity value of the capacitor is switched by converting an input voltage for oscillation frequency control into a digital signal, and using the converted digital signal. The input voltage for oscillation frequency control is an analog signal inputted from a user. Switching the electrostatic capacity value of the capacitor included in the oscillator in this way makes it possible to obtain an oscillation signal having a frequency that linearly and continuously varies with respect to the input voltage within a minute variation range. The oscillator according to the present embodiment thus makes it possible to suppress the manufacturing cost and the power consumption while maintaining the manual operability. The following sequentially describes the respective embodiments of the present disclosure created by the inventors of the present application in detail.

2. First Embodiment

First, a first embodiment of the present disclosure is described in detail with reference to FIGS. 1 and 2. FIG. 1 is a circuit diagram schematically illustrating a configuration of an oscillator 10 according to a first embodiment of the present disclosure, and FIG. 2 is a circuit diagram schematically illustrating a configuration of an oscillator 10a according to a modification example of the present embodiment.

As illustrated in FIG. 1, the oscillator 10 according to the present embodiment includes an LC oscillator (oscillation circuit) 20 including a capacity bank (capacitor) 100 and the inductor 300, an AD converter (Analog Digital Converter) (conversion circuit) (that is referred to as "ADC" in the diagram) 30, a negative resistance circuit 40, and a constant current source 50. The capacity bank (capacitor) 100 includes a plurality of capacitors (small capacitors) 102 (see FIG. 3). The oscillator 10 is an oscillator that oscillates an oscillation signal having a predetermined frequency, and the frequency of the oscillation signal linearly and continuously varies within a minute variation range in accordance with an analog signal inputted to the AD converter 30. It is to be noted that it is possible to form the oscillator 10 on one semiconductor substrate as described below.

If described in detail, in the LC oscillator 20, the capacity bank 100 and the inductor 300 are coupled in parallel. In such a case, in a case where the inductance value of the inductor of the LC oscillator 20 is represented as L and the electrostatic capacity value of the capacity bank 100 is represented as C, the frequency F of a signal to be oscillated is expressed as Expression (2) below. In the present embodiment, varying the total capacity value of the capacity bank 100 makes it possible to vary the frequency of an oscillation signal. It is to be noted that the LC oscillator 20 according to the present embodiment may be provided with the plurality of capacity banks 100 coupled in parallel, and the respective total capacity values (sum of the electrostatic capacity values of the plurality of capacitors 102 included in the capacity bank 100) of the plurality of capacity banks 100 may be the same or different from each other. In addition, the capacity bank 100 according to the present embodiment is described in detail below.

[Expression 2]

$$F = \frac{1}{2\pi\sqrt{LC}} \quad (2)$$

The negative resistance circuit 40 is coupled to the LC oscillator 20 in parallel. In the example illustrated in FIG. 1, the negative resistance circuit 40 includes an NMOS cross couple obtained by cross-coupling two n-type MOS (Metal Oxide Semiconductor) transistors 400. It is to be noted that the configuration of the negative resistance circuit 40 is not limited in particular, but may include a CMOS (Complementary Metal Oxide Semiconductor) circuit as illustrated in FIG. 2.

The constant current source 50 is coupled to the negative resistance circuit. The constant current source 50 may include various known constant current source circuits, and is replaceable with a resistor.

The AD converter 30 is a conversion circuit that is coupled to a switch 202 (see FIG. 3) for switching the electrostatic capacity value of the capacity bank 100, and converts an inputted analog signal into a digital signal. The digital signal converted by the AD converter 30 thus allow the plurality of switches (switch circuits) 202 coupled to the respective capacitors 102 of the capacity bank 100 to be switched on/off. Such switching makes it possible to vary the electrostatic capacity value of the capacity bank 100. Further, to secure operability similar to that of the radio receiver 60b including the above-described variable condenser 602, an analog signal to be inputted to the AD converter 30 is able to be a direct-current voltage obtained by a variable resistor 80 whose resistance value is variable by an input from a user.

Next, a configuration of the capacity bank 100 according to the present embodiment is described with reference to FIGS. 3 and 4. FIG. 3 is a circuit diagram schematically illustrating a configuration of the capacity bank 100 according to the present embodiment. FIG. 4 is a graph illustrating an example of variations in the oscillation frequency of the oscillator 10 according to the present embodiment.

As illustrated in FIG. 3, the capacity bank 100 according to the present embodiment includes the capacitor (if described in detail, MIM (Metal Insulator Metal) capacitor, MOM (Metal Oxide Metal) capacitor, or the like) 102 having a fixed electrostatic capacity value, and the switch 202 including an MOS transistor. If described in detail, the one switch 202, and the two capacitors 102 coupled in series on both sides of the switch 202 are included in one unit. The capacity bank 100 is configured by coupling a plurality of such units in parallel. The switch 202 of each unit is turned on/off by switching the value of a voltage applied to the gate of the MOS transistor that is the switch 202 in accordance with the above-described digital signal, and this makes it possible to discretely switch the total capacity value of the capacity bank 100. Thus, in the LC oscillator 20 including the capacity bank 100, the total capacity value of the capacity bank 100 is discretely varied by a digital signal, thereby discretely varying the frequency of an oscillation signal.

The oscillator 10 according to the present embodiment is then able to generate an oscillation signal whose oscillation frequency linearly and continuously varies with respect to an inputted digital signal as illustrated in FIG. 4 by appropriately selecting the capacity values of the respective capacitors 102 included in the capacity bank 100 and the number of capacitors 102 included in the capacity bank 100 (e.g., selecting the electrostatic capacity values of the capacitors 102 of each unit to cause the switch 202 to discretely vary the total capacity value of the capacity bank 100 within a minute variation range).

In addition, in the present embodiment, as described above, a digital signal is obtained by converting an analog signal with the AD converter 30, and the analog signal is a direct-current voltage obtained by the variable resistor 80 whose resistance value is variable by an input from a user. This allows the oscillator 10 according to the present embodiment to linearly and continuously vary the frequency of an oscillation signal in accordance with a manual operation of a user. Accordingly, it is possible to secure operability similar to that of the above-described radio receiver 60b including the variable condenser 602 according to the comparative example.

3. Second Embodiment

As described above, in the above-described first embodiment of the present disclosure, appropriately selecting the capacity values of the respective capacitors 102 included in the capacity bank 100 and the number of capacitors 102 included in the capacity bank 100 makes it possible to generate an oscillation signal whose oscillation frequency linearly and continuously varies with respect to an inputted digital signal. In the first embodiment, however, the frequency of an oscillation signal is varied by discretely switching the total capacity value of the capacity bank 100 with a digital signal. In fact, the oscillator 10 thus has to switch the total capacity value of the capacity bank 100 within a minute variation range to generate an oscillation signal whose oscillation frequency linearly and continuously varies with respect to a digital signal as illustrated in FIG. 4.

In a semiconductor manufacturing process, however, the minimum capacity value or capacity value of the manufacturable capacitor 102 is limited by the semiconductor manufacturing process in which the capacitor 102 is manufactured. It is sometimes difficult to obtain the plurality of capacitors 102 each having a desired capacity value that makes it possible to switch the total capacity value of the capacity bank 100 within a minute variation range. Accordingly, a method of controlling a frequency in the oscillator 10 is proposed in a second embodiment of the present disclosure described below. The method of controlling the frequency in the oscillator 10 makes it possible to generate an oscillation signal whose oscillation frequency linearly and continuously varies with respect to a digital signal within a minute variation range.

3.1 Comparative Example

If described in detail, in a case where the frequency of an oscillation signal is linearly and continuously varied within a minute variation range in accordance with a manual operation of a user as with the radio receiver 60b including the variable condenser 602 according to the comparative example, it is requested to switch the total capacity value of the capacity bank 100 within a minute variation range. The following describes a method of controlling a frequency according to the comparative example with reference to FIG. 25. FIG. 25 is an explanatory diagram for describing the method of controlling the frequency according to the comparative example. It is to be noted that the comparative example here means an oscillator and a method of controlling a frequency in the oscillator studied before the inventors of the present application create the embodiment of the present disclosure.

It is assumed that the oscillator according to the comparative example is provided with a fixed capacitor (electrostatic capacity value $C_0$) 104 whose electrostatic capacity value is not variable, and a capacity bank 900 including the plurality of capacitors 102 (electrostatic capacity values Cu) coupled in parallel, for example, as illustrated in the upper portion of FIG. 25. It is possible to switch the capacity value of the capacity bank 900 with the switch 202. It is to be noted that it is assumed that the fixed capacitor 104 and the capacity bank 900 are coupled in parallel in the oscillator according to the comparative example. In addition, it is assumed that each capacitor 102 of the above-described capacity bank 900 has a minimum capacity value (Cu) manufacturable in a semiconductor manufacturing process to be used.

Here, it is considered to vary the frequency of an oscillation signal in such an oscillator according to the comparative example. For example, it is assumed that the oscillator according to the comparative example uses the fixed capacitor 104 and the N capacitors 102 in the capacity bank 900 to generate an oscillation signal before a frequency adjustment as illustrated in the left portion of FIG. 25. In such a case, the total capacity value of the oscillator according to the comparative example is $C_0+NCu$. An oscillation frequency $F_0$ for the oscillator is thus expressed as Expression (3) below.

[Expression 3]

$$F_0 = \frac{1}{2\pi\sqrt{L(C_0 + NC_u)}} \quad (3)$$

Next, the oscillator according to the comparative example turns on the switch 202 of the one capacitor 102 in the capacity bank 900, and the oscillator uses the fixed capacitor 104 and the N+1 capacitors 102 in the capacity bank 900 to generate an oscillation signal after a frequency adjustment as illustrated in the right portion of FIG. 25. In such a case, the total capacity value of the oscillator according to the comparative example is $C_0+(N+1)Cu$. An oscillation frequency $F_1$ for the oscillator is thus expressed as Expression (4) below.

[Expression 4]

$$F_1 = \frac{1}{2\pi\sqrt{L(C_0 + (N+1)C_u)}} \quad (4)$$

Thus, in the oscillator according to the comparative example, a frequency difference between the oscillation frequency $F_0$ and the oscillation frequency $F_1$ serves as the minimum difference between oscillation frequencies adjustable by the oscillator. However, the capacity value Cu of each capacitor of the capacity bank 900 corresponds to the minimum capacity value manufacturable in a semiconductor manufacturing process to be used, and the value is limited by the semiconductor manufacturing process to be used. In the oscillator according to the comparative example, a frequency variation range is thus greater than a desired frequency variation range, generating an oscillation signal whose oscillation frequency discretely varies with respect to a digital signal in a rough step. In other words, it is difficult in the oscillator according to the comparative example to generate an oscillation signal whose oscillation frequency linearly and continuously varies with respect to a digital signal within a minute variation range.

3.2 Present Embodiment 1

Accordingly, the method of controlling the frequency of the oscillator 10 is proposed in the second embodiment of the present disclosure. The method of controlling the frequency of the oscillator 10 makes it possible to generate an oscillation signal whose oscillation frequency linearly and continuously varies with respect to a digital signal within a minute variation range even if the manufacturable minimum capacity value is limited by the semiconductor manufacturing process to be used. The following describes the present embodiment with reference to FIGS. 5 to 9. Each of FIGS. 5 to 7 is an explanatory diagram for describing a method of controlling a frequency according to a second embodiment of the present disclosure. In addition, FIG. 8 is an explanatory diagram describing an example of variations in a capacity value in the method of controlling the frequency according to the present embodiment. FIG. 9 is an explanatory diagram describing an example of variations in an oscillation frequency in the method of controlling the frequency according to the present embodiment. It is to be noted that FIGS. 5 to 7 each illustrate that the capacity bank 100 according to the present embodiment includes the plurality of capacitors 102 coupled in parallel, but the present embodiment is not limited thereto. The respective capacitors 102 illustrated in the diagrams may include the two capacitors 102 coupled in series.

As illustrated in the upper portion of FIG. 5, the oscillator 10 according to the present embodiment is provided with the fixed capacitor (electrostatic capacity value $C_0$) 104, a capacity bank 100-1, and a capacity bank 100-2. It is not possible to vary the electrostatic capacity value of the fixed capacitor (electrostatic capacity value $C_0$) 104. The capacity bank 100-1 includes the plurality of capacitors 102 (electrostatic capacity values Cu) (first small capacitors) coupled in parallel, and it is possible to switch the capacity value of the capacity bank 100-1 with the switch 202. The capacity bank 100-2 includes the plurality of capacitors 102 (electrostatic capacity values $C_1, C_2, \ldots, Cn$) coupled in parallel, and it is possible to switch the capacity value of the capacity bank 100-2 with the switch 202. The plurality of capacitors 102 (electrostatic capacity values $C_1, C_2, \ldots, Cn$) have electrostatic capacity values that are different from each other. Further, in the oscillator 10 according to the present embodiment, the fixed capacitor 104, the capacity bank 100-1, and the capacity bank 100-2 are coupled in parallel. It is to be noted that the fixed capacitor 104 is provided to the oscillator 10 to generate an oscillation signal having a frequency close to a desired frequency.

If described in more detail, the capacity bank 100-1 includes the N capacitors 102, and it is assumed that the capacity Cu of each capacitor 102 has the minimum capacity value (Cu) manufacturable in the semiconductor manufacturing process to be used as with the capacity bank 900 according to the comparative example. Further, the capacity bank 100-2 includes the N capacitors 102, and it is assumed that the capacity varies between the respective capacitors 102, and the capacity of each capacitor 102 has a capacity value that is a value obtained by adding a minute capacity value (minute capacity) ($\Delta C$) multiplied by an integer to the minimum capacity value (minimum unit capacity) (Cu) manufacturable in the semiconductor manufacturing process to be used. It is to be noted that it is assumed that the minute capacity value $\Delta C$ is smaller than the minimum capacity value Cu. Thus, a capacity value Cn of each capacitor 102 included in the capacity bank 100-2 is expressed as Expression (5) below. Specifically, the capacity value $C_1$ of the first capacitor (second small capacitor) is $Cu+\Delta C$. The capacity value $C_2$ of the second capacitor (third small capacitor) is $Cu+2\Delta C$.

[Expression 5]

$$C_n = Cu + n\Delta C \quad (5)$$

It is to be noted that, although depending on the semiconductor manufacturing process as described above, for example, the minimum capacity value Cu is about several tens of fF and the minute capacity value ΔC is about several fF. In addition, the one oscillator 10 may include the two or more capacity banks 100 coupled in parallel. The respective capacity banks 100 are further allowed to have total capacity values that are different from each other. In this case, the above-described minimum capacity value and minute amount value may vary between the respective capacity banks 100, and the above-described minimum capacity value is not limited to the minimum capacity value manufacturable in the semiconductor manufacturing process. More specifically, it is possible to provide the oscillator 10 according to the present embodiment with about the about 10 to 20 capacity banks 100, and provide each capacity bank 100 with the about several capacitors 102.

The method of controlling a frequency for the oscillator 10 to generate an oscillation signal whose oscillation frequency linearly and continuously varies with respect to a digital signal within a minute variation range in the oscillator 10 according to the present embodiment like this is as follows.

First, as illustrated in the upper portion of FIG. 5, all the N capacitors 102 of the capacity bank 100-1 of the oscillator 10 are turned on, and all the N capacitors 102 of the capacity bank 100-2 are turned off before a frequency adjustment. In this case, the total capacity value of the oscillator 10 is $C_0+NCu$, and the oscillation frequency $F_0$ is thus expressed as Expression (6) below.

[Expression 6]

$$F_0 = \frac{1}{2\pi\sqrt{L(C_0 + NC_u)}} \quad (6)$$

Next, as illustrated in the upper portion of FIG. 6, only the first capacitor 102 ($C_1=Cu+\Delta C$) of the capacity bank 100-2 of the oscillator 10 is turned on during a frequency adjustment. In this case, the total capacity value of the oscillator 10 is $C_0+NCu+Cu+\Delta C$, and the oscillation frequency $F_1'$ is thus expressed as Expression (7) below.

[Expression 7]

$$F_1 = \frac{1}{2\pi\sqrt{L(C_0 + (N+1)C_u + \Delta C)}} \quad (7)$$

Further, as illustrated in the upper portion of FIG. 7, the one capacitor 102 of the capacity bank 100-1 of the oscillator 10 is turned off after a frequency adjustment. The total capacity value of the oscillator 10 is $C_0+(N-1)Cu+(Cu+\Delta C)$, that is, $C_0+NCu+\Delta C$, and the oscillation frequency $F_1$ is thus expressed as Expression (8) below.

[Expression 8]

$$F_1 = \frac{1}{2\pi\sqrt{L(C_0 + NC_u + \Delta C)}} \quad (8)$$

Next, a comparison between the total capacity values and the oscillation frequencies of the oscillator 10 according to the present embodiment before the above-described frequency adjustment and after the above-described frequency adjustment is described with reference to FIGS. 8 and 9. FIGS. 8 and 9 illustrate digital signals before a frequency adjustment and after a frequency adjustment as D and D+1.

As illustrated in FIG. 8, as the total capacity values of the oscillator 10 according to the present embodiment before a frequency adjustment and after a frequency adjustment, $C_0+NCu$ varies to $C_0+NCu+\Delta C$. This demonstrates that a variation is made within the variation range (step range) of the minute capacity value ΔC. In contrast, in the comparative example described earlier, as the total capacity values before a frequency adjustment and after a frequency adjustment, $C_0+NCu$ varies to $C_0+(N+1)Cu$. A variation is thus made within the variation range of the minimum capacity value Cu.

In addition, the variations in the total capacity value as described above bring about the variations in the oscillation frequency as illustrated in FIG. 9. If described in detail, as illustrated in FIG. 9, as the oscillation frequencies of the oscillator 10 according to the present embodiment before a frequency adjustment and after a frequency adjustment, $F_0$ varies to $F_1$. If a difference between the oscillation frequency $F_0$ and the oscillation frequency $F_1$ is represented as ΔF, the minute frequency variation range ΔF corresponds to the minute capacity value ΔC. In contrast, in the comparative example described earlier, as the oscillation frequencies before a frequency adjustment and after a frequency adjustment, $F_0$ varies to $F_0-Fu$, and the oscillation frequency varies within a variation range Fu corresponding to the minimum capacity value Cu. It is to be noted that the minute capacity value ΔC is smaller than the minimum capacity value Cu, and the minute frequency variation range ΔF according to the present embodiment is thus smaller than the variation range Fu according to the comparative example.

Thus, even in a case where a semiconductor manufacturing process to be used limits the manufacturable minimum capacity value, the method of controlling a frequency according to the present embodiment allows for the presence of the minute frequency variation range ΔF. As a result, according to the present embodiment, it is possible to generate an oscillation signal whose oscillation frequency linearly and continuously varies with respect to a digital signal within a minute variation range.

It is to be noted that the method of controlling a frequency is not limited in the present embodiment to FIGS. 5 to 7, but, for example, the oscillator 10 may be controlled to directly enter the state of FIG. 7 from FIG. 5. Alternatively, in the present embodiment, for example, after the one capacitor 102 of the capacity bank 100-1 of the oscillator 10 is turned off, the first capacitor 102 ($C_1=Cu+\Delta C$) of the capacity bank 100-2 of the oscillator 10 may be turned on.

3.3 Present Embodiment 2

Further, the above-described method of controlling a frequency makes it possible to generate an oscillation signal having an oscillation frequency that varies within the minute frequency variation range corresponding to the minute capacity value ΔC. The method of controlling a frequency for the oscillator 10 in such a case is described with reference to FIGS. 10 to 12. FIG. 10 is an explanatory diagram for describing the method of controlling the frequency according to the present embodiment. In addition, FIG. 11 is an explanatory diagram describing an example of variations in a capacity value in the method of controlling the frequency according to the present embodiment. FIG. 12 is an explanatory diagram describing an example of variations in an oscillation frequency in the method of controlling the frequency according to the present embodiment.

If described in detail, in the present embodiment, the oscillator 10 is then brought from the above-described state of FIG. 7 into the state illustrated in the third row of FIG. 10. If described in detail, in the present embodiment, the first capacitor 102 ($C_1$=Cu+ΔC) of the capacity bank 100-2 of the oscillator 10 is turned off, and the second capacitor 102 ($C_2$=Cu+2ΔC) of the capacity bank 100-2 is turned on. In this case, the total capacity value of the oscillator 10 is $C_0$+NCu+2ΔC, and the oscillation frequency $F_2$ is thus expressed as Expression (9) below.

[Expression 9]

$$F_2 = \frac{1}{2\pi\sqrt{L(C_0 + NC_u + 2\Delta C)}} \quad (9)$$

Further, in the present embodiment, the oscillator 10 is then brought from the above-described state illustrated in the third row of FIG. 10 into the state illustrated in the fourth row of FIG. 10. If described in detail, in the present embodiment, the first capacitor 102 ($C_1$=Cu+ΔC) of the capacity bank 100-2 of the oscillator 10 is turned on. In this case, the total capacity value of the oscillator 10 is $C_0$+NCu+3ΔC, and the oscillation frequency $F_3$ is thus expressed as Expression (10) below.

[Expression 10]

$$F_3 = \frac{1}{2\pi\sqrt{L(C_0 + NC_u + 3\Delta C)}} \quad (10)$$

Next, a comparison between the total capacity values and the oscillation frequencies of the oscillator 10 according to the present embodiment before the above-described frequency adjustment and after the above-described frequency adjustment is described with reference to FIGS. 11 and 12. FIGS. 11 and 12 each illustrate variations in a digital signal in the above-described method of controlling a frequency as D, D+1, D+2, and D+3.

As illustrated in FIG. 11, as the oscillator 10 according to the present embodiment varies a digital signal like D, D+1, D+2, and D+3, the total capacity value varies within the variation range (step range) of the minute capacity value ΔC.

In addition, the variations in the total capacity value as described above bring about the variations in the oscillation frequency as illustrated in FIG. 12. If described in detail, as illustrated in FIG. 12, as the oscillator 10 according to the present embodiment varies a digital signal like D, D+1, D+2, and D+3, the oscillation frequency varies like $F_0$, $F_1$, $F_2$, and $F_3$. Thus, in the present embodiment, appropriately selecting the minute capacity value ΔC of the capacitor 102 included in the capacity bank 100 and the total capacity value of each capacity bank 100 makes it possible to linearly and continuously vary the oscillation frequency with respect to an inputted digital signal within a minute variation range.

For example, it is to be noted that the oscillator 10 may include the plurality of capacity banks 100 having total capacity values different from each other to linearly and continuously vary an oscillation frequency with respect to an inputted digital signal within a minute variation range in the present embodiment. Further, it is preferable to set the plurality of capacity banks 100 to cause the plurality of capacity banks 100 to have total capacity values (Cn) that sequentially and non-linearly increase step by step, thereby more linearly increasing the oscillation frequency F of the oscillation frequency in Expression (11) below. In addition, the plurality of capacitors 102 included in each capacity bank 100 preferably has electrostatic capacity values that are different from each other. Specifically, the plurality of capacitors 102 included in each capacity bank 100 each preferably has the capacity value of the value obtained by adding the minute capacity value (ΔC) multiplied by an integer to a predetermined capacity value. This causes the plurality of capacitors 102 to have electrostatic capacity values that sequentially and linearly increase step by step in the same capacity bank 100.

[Expression 11]

$$F = \frac{1}{2\pi\sqrt{LC_n}} \quad (11)$$

It is to be noted that it is not limitative that the plurality of capacitors 102 has electrostatic capacity values which sequentially and linearly increase step by step in the same capacity bank 100 in the present embodiment as described above, but the plurality of capacitors 102 may have the same electrostatic capacity value. However, in a case where the plurality of capacitors 102 has electrostatic capacity values that sequentially and linearly increase step by step, it is possible to vary an oscillation frequency over a broadband within a minute variation range while suppressing increase in the area occupied by the plurality of capacitors 102 on the semiconductor substrate.

It is to be noted that the total capacity value of the oscillator 10 is switched by using a binary code (binary system) in the above-described method of controlling a frequency, but the binary code is not limitative in the present embodiment. A thermometer code may be used that includes a string of continuous "1's" and a string of continuous "0's". In addition, in the present embodiment, a binary code may be switched to a thermometer code or vice versa for use in accordance with the total capacity value of the oscillator 10.

4. Third Embodiment

It has been described that the oscillator 10 is provided in the above-described second embodiment with the capacity bank 100 in which the plurality of capacitors 102 is coupled in parallel. However, the plurality of capacitors 102 in the capacity bank 100 according to the embodiment of the present disclosure does not have to be coupled in parallel, but may also be coupled in series. Accordingly, as a third embodiment of the present disclosure, a capacity bank 100a in which the plurality of capacitors 102 is coupled in series, and a method of controlling an oscillation frequency in the oscillator 10 including the capacity bank 100a are described with reference to FIGS. 13 and 14. FIG. 13 is a circuit diagram schematically illustrating a configuration of the capacity bank 100a according to the third embodiment of the present disclosure, and FIG. 14 is an explanatory diagram for describing the method of controlling a frequency according to the present embodiment.

4.1 Configuration of Capacity Bank 100a

First, a configuration of the capacity bank 100a according to the present embodiment is described with reference to FIG. 13. As illustrated in FIG. 13, in the capacity bank 100a according to the present embodiment, the plurality of capacitors 102 is coupled in series. In addition, it is assumed that the capacity value Cu of each capacitor 102 corresponds to the minimum capacity value manufacturable in the semiconductor manufacturing process to be used. Further, these capacitors 102 are coupled to each other via the switch 202 including a MOS transistor. Additionally, the capacity bank 100a includes a coupling line 204 extending along the line of the plurality of these capacitors 102 coupled in series. The coupling line 204 and each node 206 are coupled via the switch 202. Each node 206 is located between the two capacitors 102.

4.2 Method of Controlling Frequency

Next, the method of controlling an oscillation frequency in the oscillator 10 including the capacity bank 100a according to the present embodiment as illustrated in FIG. 13 is described with reference to FIG. 14. It is assumed that the oscillator 10 according to the present embodiment is provided with a fixed capacitor (electrostatic capacity value $C_0$) 104 whose electrostatic capacity value is not variable, and the capacity bank 100a including the plurality of capacitors 102 (electrostatic capacity values Cu) coupled in series as illustrated in the lower portion of FIG. 14. It is possible to switch the capacity value of the capacity bank 100a with the switch 202. Further, in the oscillator 10 according to the present embodiment, the fixed capacitor 104 and the capacity bank 100a are coupled in parallel.

The method of controlling a frequency for the oscillator 10 to generate an oscillation signal whose oscillation frequency linearly and continuously varies with respect to a digital signal within a minute variation range in the oscillator 10 according to the present embodiment like this is as follows.

First, as illustrated in the left portion of FIG. 14, before a frequency adjustment, the switches 202 are turned on to couple all the M capacitors 102 of the capacity bank 100a in the oscillator 10 in series. In this case, the oscillator 10 uses the fixed capacitor 104 and the M capacitors 102 coupled in series to generate an oscillation signal. The total capacity value of the oscillator 10 is expressed as Expression (12) below. It is to be noted that it is assumed that ΔC of the following expression is equal to Cu/M.

[Expression 12]

$$C = C_0 + \frac{Cu}{M} \qquad (12)$$
$$= C_0 + \Delta C$$

Next, as illustrated in the right portion of FIG. 14, after a frequency adjustment, the switches 202 are turned off, and half the M capacitors 102 of the capacity bank 100a are uncoupled from the series coupling. In this case, the oscillator 10 uses the fixed capacitor 104 and the M/2 capacitors 102 coupled in series to generate an oscillation signal. The total capacity value of the oscillator 10 is expressed as Expression (13) below.

[Expression 13]

$$C = C_0 + \frac{Cu}{M/2} \qquad (13)$$
$$= C_0 + 2\Delta C$$

That is, in the present embodiment, even in a case where the capacity bank 100a including the plurality of capacitors 102 coupled in series is used, switching the number of capacitors 102 coupled in series makes it possible to vary the total capacity value of the oscillator 10 within a minute variation range.

However, in the present embodiment, in a case where there is a great difference between the minimum capacity value Cu and the variation range of a desired total capacity value, the number M of the capacitor 102 coupled in series in the capacity bank 100a increases, which also increases the number of switches 202 that control the number M of capacitors 102 coupled in series. In such a case, this may lead to increase in the area of the semiconductor chip in which the oscillator 10 is provided, and increase the manufacturing cost. Further, it is possible to set nothing but an integer as the number M of capacitors 102 coupled in series, and this thus reduces the degree of freedom for variability in the total capacity value of the oscillator 10. Thus, from such a viewpoint, it is preferable to use the capacity bank 100 in which the plurality of capacitors 102 is coupled in parallel like the above-described second embodiment.

5. Fourth Embodiment

In the above-described embodiment of the present disclosure, appropriately selecting the minute capacity value ΔC of the capacitor 102 included in the capacity bank 100 and the total capacity value of each capacity bank 100 makes it possible to linearly and continuously vary the oscillation frequency with respect to an inputted digital signal within a minute variation range. Further, the capacity bank 100 like this is provided on the semiconductor substrate. As a fourth embodiment of the present disclosure, the capacity bank 100 provided on the semiconductor substrate is then described with reference to FIGS. 15 and 16. FIG. 15 is a layout diagram schematically illustrating a configuration example of the capacitor 102 according to the fourth embodiment of the present disclosure, and FIG. 16 is a layout diagram schematically illustrating a configuration example of the oscillator 10 according to the present embodiment. It is to be noted that these layout diagrams each omit a wiring line, an element, or the like, but illustrate only a main portion according to the present embodiment for the sake of simplicity.

If described in detail, as illustrated in FIG. 15, the one capacity bank 100 according to the present embodiment includes the plurality of capacitors 102 and the plurality of switches 202 each including a MOS transistor. The plurality of capacitors 102 and the plurality of switches 202 are arranged on a semiconductor substrate 800. The electrostatic capacity values of the plurality of capacitors 102 sequentially and linearly vary step by step in the vertical direction of FIG. 15. Thus, the layout areas occupied by the respective capacitors 102 also sequentially and linearly vary step by step. In addition, in the example illustrated in FIG. 15, seven rows of capacitor pairs 106 are provided in the vertical direction of the diagram. The two capacitors 102 of each capacitor pair 106 having the same electrostatic capacity value are disposed across the switch 202 to have line symmetry. Further, the two capacitors 102 of each capacitor pair 106 are coupled to the switch 202 by coupling lines (wiring lines) 204.

Further, in the present embodiment, the plurality of capacity banks 100 each having the configuration as illustrated in FIG. 15 is formed on the semiconductor substrate 800. For example, as illustrated in FIG. 16, the oscillator 10 according to the present embodiment has a capacity bank formation region 804 on the semiconductor substrate 800. In the capacity bank formation region 804, the plurality of capacity banks 100 is formed. Further, the oscillator 10 according to the present embodiment may have an inductor formation region 802, a negative resistance circuit formation region 806, a frequency divider formation region 808, and the like on the semiconductor substrate 800. In the inductor formation region 802, the inductor 300 is formed. In the negative resistance circuit formation region 806, the negative resistance circuit 40 and the like are formed. In the frequency divider formation region 808, the frequency divider 710 described below is formed.

If described in more detail, the plurality of capacity banks 100 may have total capacity values that are different from each other. Specifically, the plurality of capacity banks 100 has total capacity values that sequentially and non-linearly increase step by step. Thus, the layout areas occupied by the respective capacity banks 100 also sequentially and non-linearly vary step by step. In addition, the capacity bank formation region 804 may be provided with the fixed capacitor 104, and may be provided with a dummy capacitor (not illustrated) unrelated to the generation of an oscillation signal to more accurately form each capacitor 102.

Further, the inductor 300 formed in the inductor formation region 802 may be an inductor element and may be formed by a wiring line. The inductor 300 is not limited in particular.

It is to be noted that each of the layout diagrams illustrated in FIGS. 15 and 16 is merely an example. The capacity bank 100 and oscillator 10 according to the present embodiment do not have to have the forms illustrated in FIGS. 15 and 16.

6. Fifth Embodiment

6.1 Configuration of Radio Receiver 60

The oscillator 10 according to the embodiment of the present disclosure described above is applicable, for example, to the radio receiver 60. As a fifth embodiment of the present disclosure, an example of the radio receiver 60 to which the oscillator 10 according to the present embodiment is applied is then described with reference to FIG. 17. FIG. 17 is a circuit diagram schematically illustrating a configuration of the radio receiver 60 according to the fifth embodiment of the present disclosure.

The oscillation frequency of the oscillator 10 is controlled with a direct-current input voltage in the radio receiver 60 according to the present embodiment to make it possible to select a radio broadcasting station. The direct-current input voltage is obtained by mechanically varying the resistance value of the variable resistor 80 with a manual operation of a user.

The radio receiver 60 illustrated in FIG. 17 converts the above-described input voltage that is an analog signal into a digital signal, and uses the digital signal resulting from the conversion to switch the total capacity value of the oscillator 10. This makes it possible to obtain an oscillation signal having a desired frequency from the oscillator 10. This allows the radio receiver 60 according to the present embodiment to supply the oscillation signal obtained in this way from a local oscillation signal generator 70 including the above-described oscillator 10 to the mixer circuit (frequency conversion circuit) 704 as a local signal to convert a radio signal into an IF signal.

If described in detail, as illustrated in FIG. 17, an inputted radio signal of the radio receiver 60 is amplified by the RF amplifier 702 and converted by the two mixer circuits 704 into two (I signal and Q signal) IF signals. Local oscillation signals whose phases are orthogonal to each other are inputted to the two mixer circuits 704. Further, the band-pass filter 718 removes image interfering waves from the converted IF signals, and the demodulator (demodulation circuit) 722 then performs AM/FM demodulation to offer a sound signal.

It is to be noted that the radio receiver 60 according to the present embodiment may adopt a superheterodyne method in which a signal is temporarily converted into an IF signal as described above, or may adopt a direct conversion method in which a signal is directly converted into a baseband signal. It is to be noted that each block such as the mixer circuits 704 or the demodulator 722 of the above-described radio receiver 60 is preferably provided on one semiconductor chip along with the oscillator 10 or the local oscillation signal generator 70 including the oscillator 10.

6.2 Configuration of Local Oscillation Signal Generator 70

Incidentally, in a case where the one radio receiver 60 receives an FM/AM radio broadcast, the frequency of a local oscillation signal (local signal) used for the reception depends on a broadcast band. Specifically, the frequency of a local oscillation signal is 76 MHz to 108 MHz, for example, for receiving an FM broadcast in a case where the frequency of an IF signal is 150 kHz. In addition, the frequency of a local oscillation signal is 575.6 kHz to 1766.1 kHz, for example, for receiving an AM broadcast in a case where the frequency of an IF signal is 55 kHz.

Accordingly, the radio receiver 60 according to the present embodiment is provided with the local oscillation signal generator 70 to support both AM/FM radio broadcasts. The local oscillation signal generator 70 makes it possible to switch the number of frequencies divided by the frequency divider 710 between FM reception and AM reception when the frequency of an oscillation signal generated by the oscillator 10 is divided.

The local oscillation signal generator 70 according to the present embodiment that makes it possible to switch the number of divided frequencies as described above is then described with reference to FIGS. 18 to 21. FIG. 18 is a circuit diagram schematically illustrating a configuration of the local oscillation signal generator 70 according to the present embodiment. FIG. 19 is an explanatory diagram for describing frequency division by the local oscillation signal generator 70 according to the present embodiment. Further, each of FIGS. 20 and 21 is a graph illustrating an example of variations in the frequency of the local oscillation signal generator 70 according to the present embodiment.

Incidentally, the frequency of a local oscillation signal for FM reception ranges from 76 MHz to 108 MHz, offering a frequency variation rate of 1.42 times or more. In addition, the frequency of a local oscillation signal for AM reception ranges from 575.6 kHz to 1766.1 kHz, offering a frequency variation rate of about 3.068 times. The local oscillation frequency is thus requested of frequency variation rates that are greatly different between FM reception and AM reception.

However, in a case where a local oscillation frequency of 575.6 kHz to 1766.1 kHz for AM reception is equally divided into three with the same width, each range has a frequency variation rate of about 1.453 times. This is substantially the same as the frequency variation rate for FM reception. Accordingly, in the present embodiment, the band of the AM signal is equally divided into three by securing about 76 MHz to 110 MHz as the range of the local oscillation frequency for FM reception, and further selecting the number of divided frequencies. This makes it possible to support both AM/FM broadcasts even in a case where the one oscillator 10 is used.

If described in detail, as illustrated in FIG. 18, the local oscillation signal generator 70 that generates a local oscillation signal to be inputted to the mixer circuit 704 includes a frequency divider 710*a* that divides the frequency of an oscillation signal from the oscillator 10 into four in addition to the above-described oscillator 10. Further, the local oscillation signal generator 70 includes a frequency divider 710*b* and a frequency divider 710*c*. The frequency divider 710*b* divides the frequency of a signal from the frequency divider 710*a* into N. The frequency divider 710*c* divides the frequency of a signal from the frequency divider 710*a* or the frequency divider 710*b* into four. Additionally, the local oscillation signal generator 70 includes a switch 208 and a controller (control circuit section) 210. The switch 208 switches a path of a signal from the frequency divider 710*a*. The controller (control circuit section) 210 controls the frequency divider 710*b* and the switch 208. Further, it is assumed that the frequency divider 710*b* is able to switch the number of divided frequencies between three types: 131 divided frequencies; 90 divided frequencies; and 62 divided frequencies. It is to be noted that the above-described local oscillation signal generator 70 is preferably provided on one semiconductor chip along with each block such as the mixer circuit 704 or the demodulator 722 of the radio receiver 60.

Next, the operation of the local oscillation signal generator 70 illustrated in FIG. 18 is described with reference to FIG. 19. First, an oscillation signal generated by the oscillator 10 has a frequency of 1206.4 to 1752 MHz, and has a path led by the switch 208 through the frequency divider 710*a* and the frequency divider 710*c* for FM reception as illustrated in the uppermost row of FIG. 19. Thus, the frequency of the above-described oscillation signal is divided into four by each of the frequency dividers 710*a* and 710*c*. That is, the frequency of the above-described oscillation signal is divided into sixteen. As a result, the local oscillation signal generator 70 is able to obtain a local oscillation signal having a frequency within a range of 76 MHz to 108 MHz.

Further, the switch 208 is switched for AM reception to lead an oscillation signal from the frequency divider 710*a* to the frequency divider 710*b*. The AM band is divided into three bands MW1 (575. KHz to 835 KHz), MW2 (837.8 kHz to 1216.7 KHz), and MW3 (1216.1 KHz to 1766.1 KHz) for AM reception, and the number of frequencies divided by the frequency divider 710*b* is switched in accordance with the bands.

First, for receiving an AM signal having the frequency of MW1 (575. KHz to 835 KHz), as illustrated in the second row of FIG. 19, the frequency of an oscillation signal (1206.4 to 1752 MHz) generated by the oscillator 10 is divided into four by the frequency divider 710*a*, and further divided into 131 by the frequency divider 710*b*. Further, the frequency of a signal whose frequency has been divided by the frequency divider 710*b* is divided into four by the frequency divider 710*c*. That is, the frequency of the above-described oscillation signal is divided into 2096. This allows the local oscillation signal generator 70 to obtain a local oscillation signal having the frequency within a range of 575. KHz to 835 KHz.

Next, for receiving an AM signal having the frequency of MW2 (837.8 kHz to 1216.7 KHz), as illustrated in the third row of FIG. 19, the frequency of an oscillation signal (1206.4 to 1752 MHz) generated by the oscillator 10 is divided into four by the frequency divider 710*a*, and further divided into 90 by the frequency divider 710*b*. Further, the frequency of a signal whose frequency has been divided by the frequency divider 710*b* is divided into four by the frequency divider 710*c*. That is, the frequency of the above-described oscillation signal is divided into 1440. This allows the local oscillation signal generator 70 to obtain a local oscillation signal having the frequency within a range of 837.8 kHz to 1216.7 KHz.

Further, for receiving an AM signal having the frequency of MW3 (1216.1 kHz to 1766.1 KHz), as illustrated in the fourth row of FIG. 19, the frequency of an oscillation signal (1206.4 to 1752 MHz) generated by the oscillator 10 is divided into four by the frequency divider 710*a*, and further divided into 62 by the frequency divider 710*b*. Further, the frequency of a signal whose frequency has been divided by the frequency divider 710*b* is divided into four by the frequency divider 710*c*. That is, the frequency of the above-described oscillation signal is divided into 992. This allows the local oscillation signal generator 70 to obtain a local oscillation signal having the frequency within a range of 1216.1 KHz to 1766.1 KHz.

In this way, in the present embodiment, when the frequency of an oscillation signal generated by the oscillator 10 is divided, the number of divided frequencies is switched between FM reception and AM reception. Further, the number of divided frequencies is switched for each of bands obtained by equally dividing the band of an AM signal into three. As a result, in the present embodiment, even the radio receiver 60 provided with the local oscillation signal generator 70 including the one oscillator 10 is able to support both AM/FM broadcasts.

As can be seen from FIG. 20, the local oscillation signal generator 70 like this makes it possible to obtain a local oscillation signal having a frequency that linearly and continuously varies with respect to an inputted digital signal within a minute variation range for receiving an FM signal. In addition, as can be seen from FIG. 21, the local oscillation signal generator 70 also makes it possible to obtain, for each band, a local oscillation signal having a frequency that linearly and continuously varies with respect to an inputted digital signal within a minute variation range for receiving an AM signal.

It is to be noted that the number of frequencies divided by each frequency divider 710 or the frequency of an oscillation signal from the oscillator 10 is not limited to the above in the present embodiment, but is selectable as appropriate. Further, the configuration of the local oscillation signal generator 70 is not also limited to the configuration illustrated in FIG. 18 in the present embodiment, but is variable as appropriate.

7. Conclusion

As described above, according to the embodiment of the present disclosure, it is possible to obtain the oscillator 10 that is able to generate an oscillation signal whose oscillation frequency linearly and continuously varies within a minute variation range in accordance with a manual operation of a user. The oscillator 10 according to the present embodiment thus makes it possible to secure operability similar to that of the radio receiver 60b including the variable condenser 602 according to the comparative example. Additionally, according to the present embodiment, the variable condenser 602 or the PLL synthesizer 716 is not used, thereby making it possible to suppress the manufacturing cost and the power consumption.

In addition, it has been described that the above-described oscillator 10 according to the embodiment of the present disclosure is applied to the radio receiver 60. The oscillator 10 according to the embodiment of the present disclosure is not, however, limited to the application to the radio receiver 60, but is applicable to various wireless communication apparatuses each of which is requested to suppress the power consumption and be smaller, and mounted on a smartwatch, a wearable terminal, or the like.

8. Supplement

A preferred embodiment(s) of the present disclosure has/have been described above in detail with reference to the accompanying drawings, but the technical scope of the present disclosure is not limited to such an embodiment(s). It is apparent that a person having ordinary skill in the art of the present disclosure may arrive at various alterations and modifications within the scope of the technical idea described in the appended claims, and it is understood that such alterations and modifications naturally fall within the technical scope of the present disclosure.

In addition, the effects described herein are merely illustrative and exemplary, and not limitative. That is, the technology according to the present disclosure may exert other effects that are apparent to those skilled in the art from the description herein, in addition to the above-described effects or in place of the above-described effects.

It is to be noted that the following configurations also fall within the technical scope of the present disclosure.

(1)

A semiconductor device including:

an oscillation circuit including a plurality of capacitors provided on a semiconductor substrate;

a conversion circuit that converts an analog signal into a digital signal; and a switch circuit that switches the capacitors on the basis of the digital signal, an oscillation frequency linearly varying with respect to a variation in the analog signal.

(2)

The semiconductor device according to (1), in which the switch circuit switches the plurality of capacitors on the basis of the digital signal, the plurality of capacitors having respective capacity values selected to linearly vary the oscillation frequency.

(3)

The semiconductor device according to (1) or (2), further including a variable resistor that generates the analog signal.

(4)

The semiconductor device according to (2), in which the plurality of capacitors is provided to sequentially and non-linearly increase the capacity values.

(5)

The semiconductor device according to (4), in which the plurality of capacitors is coupled in parallel.

(6)

The semiconductor device according to (1), in which each of the capacitors includes a plurality of small capacitors.

(7)

The semiconductor device according to (6), in which the plurality of small capacitors is switched by the switch circuit.

(8)

The semiconductor device according to (7), in which the plurality of small capacitors is coupled in series.

(9)

The semiconductor device according to (8), in which each of the small capacitors has a capacity value of minimum unit capacity determined in a semiconductor manufacturing process.

(10)

The semiconductor device according to (7), in which the plurality of small capacitors is coupled in parallel.

(11)

The semiconductor device according to (10), in which the plurality of small capacitors includes a first small capacitor and a second small capacitor, the first small capacitor having a capacity value of minimum unit capacity, the second small capacitor having a capacity value obtained by adding minute capacity to the minimum unit capacity, and the minute capacity is smaller than the minimum unit capacity.

(12)

The semiconductor device according to (11), in which the plurality of small capacitors of each of the capacitors further includes a third small capacitor having a capacity value obtained by adding a capacity value twice as large as the capacity value of the minute capacity to the minimum unit capacity.

(13)

The semiconductor device according to (11) or (12), in which the minimum unit capacity or the minute capacity varies between the capacitors.

(14)

The semiconductor device according to any one of (1) to (13), in which the oscillation circuit includes an inductor.

(15)

The semiconductor device according to any one of (1) to (14), further including:

a frequency conversion circuit that uses an oscillation signal from the oscillation circuit as a local signal; and a demodulation circuit that performs demodulation into a signal from the frequency conversion circuit.

(16)

The semiconductor device according to (15), further including:

a frequency divider that divides a frequency of the oscillation signal from the oscillation circuit; and a control circuit section that switches a number of frequencies divided by the frequency divider.

(17)

The semiconductor device according to (16), in which the control circuit section switches the number of divided frequencies in accordance with a frequency of an inputted signal.

(18)

A wireless communication apparatus including a semiconductor device including an oscillation circuit including a plurality of capacitors provided on a semiconductor substrate, a conversion circuit that converts an analog signal into a digital signal, and
a switch circuit that switches the capacitors on the basis of the digital signal,
an oscillation frequency linearly varying with respect to a variation in the analog signal.

REFERENCE SIGNS LIST 10, 10a, 90a, 90b oscillator
20 LC oscillator
30 AD converter
40, 40a negative resistance circuit
50 constant current source
60, 60a, 60b radio receiver
70 local oscillation signal generator
80 variable resistor
100, 100a, 900 capacity bank
102 capacitor
104 fixed capacitor
106 capacitor pair
202, 208 switch
204 coupling line
206 node
210 controller
300 inductor
400 n-type MOS transistor
402 p-type MOS transistor
502 variable capacitor
602 variable condenser
702 RF amplifier
704 mixer circuit
706 crystal oscillator
708 phase comparator
710, 710a, 710b, 710c frequency divider
712 charge pump
714 loop filter
716 PLL synthesizer
718 filter
720 IF amplifier
722 demodulator
800 semiconductor substrate
802 inductor formation region
804 capacity bank formation region
806 negative resistance circuit formation region
808 frequency divider formation region

The invention claimed is:
1. A semiconductor device, comprising:
an oscillation circuit that includes a plurality of capacitors on a semiconductor substrate;
a variable resistor configured to receive a user input and generate an analog signal based on the received user input;
a conversion circuit configured to convert the generated analog signal into a digital signal; and
a switch circuit configured to switch the plurality of capacitors based on the digital signal, wherein
an oscillation frequency linearly varies with respect to a variation in the generated analog signal.
2. The semiconductor device according to claim 1, wherein
the linear variation of the oscillation frequency is based on respective capacity values of the plurality of capacitors.
3. The semiconductor device according to claim 2, wherein the plurality of capacitors is configured to sequentially and non-linearly increase the respective capacity values of the plurality of capacitors.
4. The semiconductor device according to claim 3, wherein the plurality of capacitors is coupled in parallel.
5. The semiconductor device according to claim 1, wherein each of the plurality of capacitors includes a plurality of small capacitors.
6. The semiconductor device according to claim 5, wherein the switch circuit is further configured to switch the plurality of small capacitors of each of the plurality of capacitors.
7. The semiconductor device according to claim 6, wherein the plurality of small capacitors of each of the plurality of capacitors is coupled in series.
8. The semiconductor device according to claim 7, wherein
each of the plurality of small capacitors has a specific capacity value determined in a semiconductor manufacturing process.
9. The semiconductor device according to claim 6, wherein the plurality of small capacitors of each of the plurality of capacitors is coupled in parallel.
10. The semiconductor device according to claim 9, wherein
the plurality of small capacitors includes a first small capacitor and a second small capacitor,
the first small capacitor has a first capacity value,
the second small capacitor has a second capacity value,
the second capacity value is sum of minute capacity value and the first capacity value, and
the minute capacity value is smaller than the first capacity value.
11. The semiconductor device according to claim 10, wherein
the plurality of small capacitors further includes a third small capacitor having a third capacity value,
the third capacity value is a sum of a specific capacity value and the first capacity value, and
the specific capacity value is twice the minute capacity value.
12. The semiconductor device according to claim 10, wherein one of the first capacity value or the minute capacity value varies between the plurality of small capacitors.
13. The semiconductor device according to claim 1, wherein the oscillation circuit includes an inductor.
14. The semiconductor device according to claim 1, further comprising:
a frequency conversion circuit configured to generate a specific signal based on a local signal from the oscillation circuit; and
a demodulation circuit configured to demodulate the generated specific signal from the frequency conversion circuit.
15. The semiconductor device according to claim 14, further comprising:
a frequency divider configured to divide a frequency of the oscillation signal from the oscillation circuit into a number of divided frequencies; and
a control circuit section configured to switch the number of divided frequencies.
16. The semiconductor device according to claim 15, wherein
the control circuit section is further configured to switch the number of divided frequencies based on a frequency of an inputted signal.

17. A wireless communication apparatus, comprising:
a semiconductor device including:
- an oscillation circuit that includes a plurality of capacitors on a semiconductor substrate;
- a variable resistor configured to receive a user input and generate an analog signal based on the received user input;
- a conversion circuit configured to convert the generated analog signal into a digital signal; and
- a switch circuit configured to switch the plurality of capacitors based on the digital signal, wherein
an oscillation frequency linearly varies with respect to a variation in the generated analog signal.

* * * * *